(12) United States Patent
Inoue et al.

(10) Patent No.: US 11,888,458 B2
(45) Date of Patent: Jan. 30, 2024

(54) FILTER AND MULTIPLEXER

(71) Applicant: TAIYO YUDEN CO., LTD., Tokyo (JP)

(72) Inventors: Makoto Inoue, Tokyo (JP); Naoto Kobayashi, Tokyo (JP); Hideyuki Sekine, Tokyo (JP); Jaeho Jeong, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 17/847,565

(22) Filed: Jun. 23, 2022

(65) Prior Publication Data
US 2022/0416763 A1    Dec. 29, 2022

(30) Foreign Application Priority Data

Jun. 24, 2021    (JP) ................. 2021-104675

(51) Int. Cl.
| | | |
|---|---|---|
| H03H 7/06 | (2006.01) | |
| H03H 7/01 | (2006.01) | |
| H03H 9/54 | (2006.01) | |
| H03H 9/70 | (2006.01) | |
| H03H 9/15 | (2006.01) | |

(52) U.S. Cl.
CPC ............ *H03H 7/06* (2013.01); *H03H 7/0115* (2013.01); *H03H 7/0138* (2013.01); *H03H 9/15* (2013.01); *H03H 9/542* (2013.01); *H03H 9/70* (2013.01)

(58) Field of Classification Search
CPC . H03H 2001/0085; H03H 7/0115; H03H 7/06

USPC .......................... 333/175, 185, 172
See application file for complete search history.

(56) References Cited

U.S. PATENT DOCUMENTS

| | | | | |
|---|---|---|---|---|
| 6,097,269 A | * | 8/2000 | Hernandez | ........... H03H 7/0115 |
| | | | | 455/340 |
| 2003/0076199 A1 | * | 4/2003 | Yamaguchi | ......... H01P 1/20381 |
| | | | | 333/175 |
| 2015/0236748 A1 | * | 8/2015 | Nobbe | ..................... H04B 1/18 |
| | | | | 455/78 |
| 2018/0226952 A1 | | 8/2018 | Tanaka et al. | |

FOREIGN PATENT DOCUMENTS

JP    2018-129683 A    8/2018

* cited by examiner

*Primary Examiner* — Rakesh B Patel
(74) *Attorney, Agent, or Firm* — CHEN YOSHIMURA LLP

(57) ABSTRACT

A filter includes an input terminal, an output terminal, a ground terminal, a first capacitor and a second capacitor that are connected in series between the input terminal and the output terminal, a capacitive element that is connected in parallel to the first capacitor and the second capacitor between the input terminal and the output terminal, and has a Q factor that is smaller than a Q factor of the first capacitor and is smaller than a Q factor of the second capacitor, and an inductor that has a first end and a second end, the first end being coupled to a node that is provided between the first capacitor and the second capacitor and that is coupled to the capacitive element through the first capacitor and the second capacitor, the second end being coupled to the ground terminal.

15 Claims, 18 Drawing Sheets

FILTER AND MULTIPLEXER

FIELD

A certain aspect of the present disclosure relates to a filter and a multiplexer.

BACKGROUND

It has been known that by connecting an acoustic wave resonator in series with a capacitor of a T-type CLC filter, the filter has an attenuation pole near the passband, as disclosed in, for example, Japanese Patent Application Publication No. 2018-129683.

RELATED ART DOCUMENTS

Patent Documents

Japanese Patent Application Publication No. 2018-129683

SUMMARY

In the filter having an attenuation pole, it may be desired to increase the steepness of the attenuation pole (i.e., increase the Q factor). To improve the Q factor (Quality factor), it is common to increase the Q factors of the capacitor and the inductor that form the attenuation pole. However, it is difficult to increase the Q factors of the capacitor and the inductor.

The present disclosure has been made in view of above problems, and has an objective of improving the steepness of the attenuation pole.

The present disclosure provides, in one aspect, a filter including: an input terminal; an output terminal; a ground terminal; a first capacitor and a second capacitor that are connected in series between the input terminal and the output terminal; a capacitive element that is connected in parallel to the first capacitor and the second capacitor between the input terminal and the output terminal, and has a Q factor that is smaller than a Q factor of the first capacitor and is smaller than a Q factor of the second capacitor; and an inductor that has a first end and a second end, the first end being coupled to a node that is provided between the first capacitor and the second capacitor and that is coupled to the capacitive element through the first capacitor and the second capacitor, the second end being coupled to the ground terminal.

In the above filter, the Q factor of the capacitive element may be equal to or less than 0.6 times the Q factor of the first capacitor and equal to or less than 0.6 times the Q factor of the second capacitor.

The above filter may be a high-pass filter having a passband, and the first capacitor, the second capacitor, the capacitive element, and the inductor may form a first minimum of a first attenuation pole at a frequency lower than the passband.

In the above filter, the capacitive element may be an acoustic wave resonator, and the acoustic wave resonator may form a second minimum of a second attenuation pole between the first minimum and the passband.

In the above filter, the capacitive element may be a third capacitor.

The present disclosure provides, in another aspect, a filter including: an input terminal; an output terminal; a ground terminal; a first capacitor and a second capacitor that are connected in series between the input terminal and the output terminal; a capacitive element that is connected in parallel to the first capacitor and the second capacitor between the input terminal and the output terminal; a resistive element that is connected in parallel to the first capacitor and the second capacitor and is connected in series with and/or connected in parallel to the capacitive element, between the input terminal and the output terminal; and an inductor that has a first end and a second end, the first end being coupled to a node that is provided between the first capacitor and the second capacitor and that is coupled to the capacitive element through the first capacitor and the second capacitor, the second end being coupled to the ground terminal.

In the above filter, a combined Q factor of the capacitive element and the resistive element may be equal to or less than 0.6 times a Q factor of the first capacitor and equal to or less than 0.6 times a Q factor of the second capacitor.

The above filter may be a high-pass filter having a passband, and the first capacitor, the second capacitor, the capacitive element, and the inductor may form a first minimum of a first attenuation pole at a frequency lower than the passband.

In the above filter, the capacitive element may be an acoustic wave resonator, and the acoustic wave resonator may form a second minimum of a second attenuation pole between the first minimum and the passband.

In the above filter, the capacitive element may be a third capacitor.

In the above filter, the first capacitor, the second capacitor, and the third capacitor may have Q factors substantially equal to each other.

The present disclosure provides, in another aspect, a multiplexer including the above filter.

DETAILED DESCRIPTION

Hereinafter, a description will be given of embodiments of the present disclosure with reference to the accompanying drawings.

First Embodiment

Figure 1:
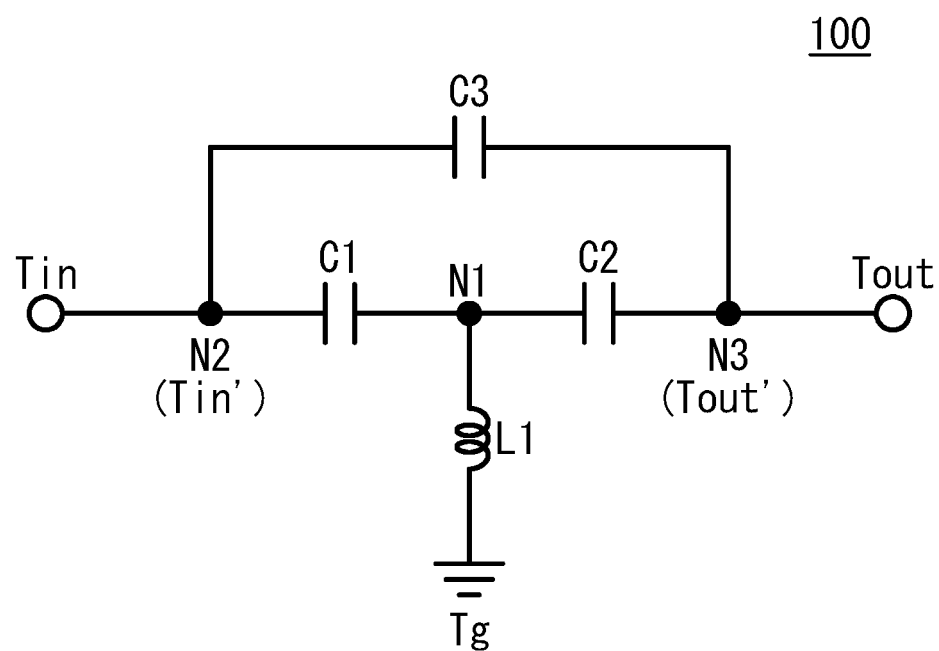
FIG. 1 is a circuit diagram of a filter in accordance with a first embodiment.

A first embodiment is an exemplary high-pass filter. FIG. 1 is a circuit diagram of a filter in accordance with the first embodiment.

As illustrated in FIG. 1, in a filter 100 in accordance with the first embodiment, capacitors C1 and C2 are connected in series between an input terminal Tin and an output terminal Tout. Between the input terminal Tin and the output terminal Tout, a capacitor C3 is connected in parallel to the capacitors C1 and C2. A node between the capacitors C1 and C2 is a node N1. An inductor L1 has a first end coupled to the node N1 and a second end coupled to a ground terminal Tg, and is shunt-connected to a path between the input terminal Tin and the output terminal Tout. A node to which the capacitors C1 and C3 are coupled is a node N2. A node to which the capacitors C2 and C3 are coupled is a node N3. There are only two paths connecting the node N1 and the capacitor C3, which are the path from the node N1 to the capacitor C3 through the capacitor C1 and the path from the node N1 to the capacitor C3 through the capacitor C2. That is, the node N1 is not connected to the capacitor C3 without the capacitors C1 and C2. The filter 100 transmits signals in the passband to the output terminal Tout among high-frequency signals input to the input terminal Tin, and suppresses signals with other frequencies.

Figure 2:
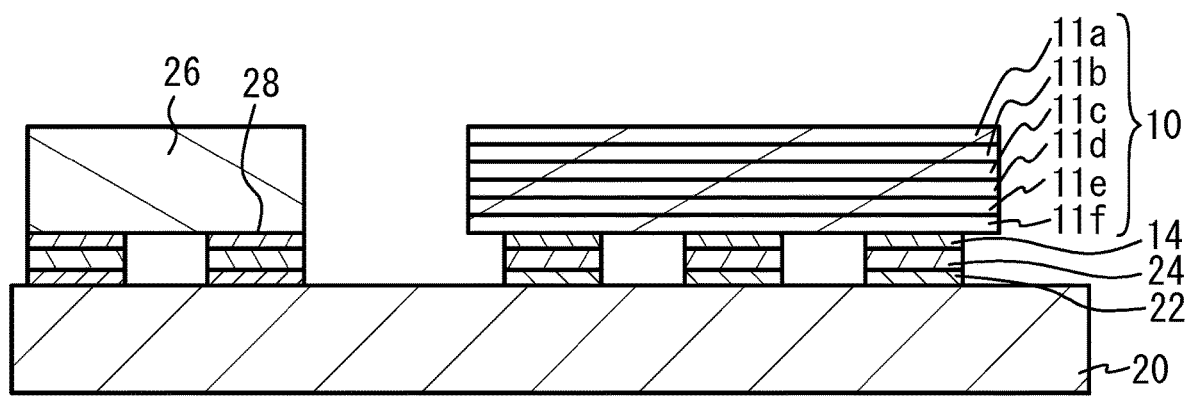
FIG. 2 is a cross-sectional view of a multilayered body in the first embodiment mounted on a substrate.

FIG. 2 is a cross-sectional view of a multilayered body in the first embodiment mounted on a substrate. As illustrated in FIG. 2, a multilayered body 10 and an electronic component 26 are mounted on a substrate 20. The multilayered body 10 includes the capacitors C1 and C2, and the inductor L1, and includes dielectric layers 11a to 11f. Terminals 14 are disposed on the bottom surface of the multilayered body 10. Terminals 28 are disposed on the bottom surface of the electronic component 26. Terminals 22 are disposed on the substrate 20. The terminal 14 and the terminal 22 are bonded by a bonding material 24, and the terminal 28 and the terminal 22 are bonded by the bonding material 24.

Figure 3A:
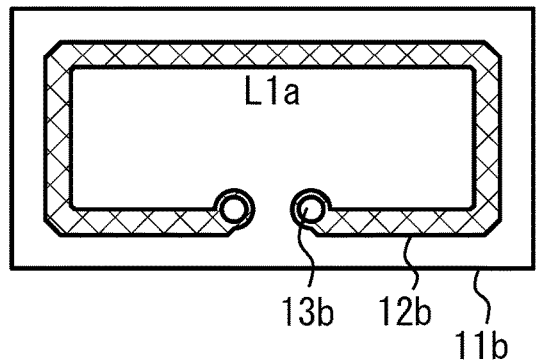
FIG. 3A to FIG. 3F are plan views of dielectric layers in the first embodiment.
Figure 3D:
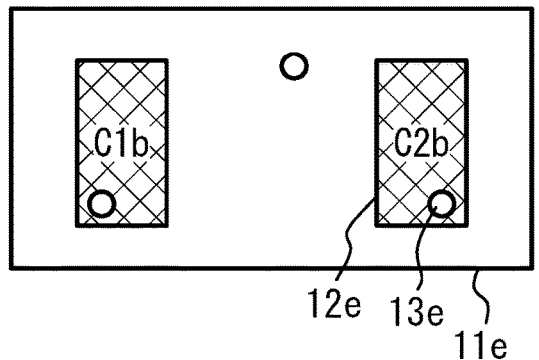
Figure 3B:
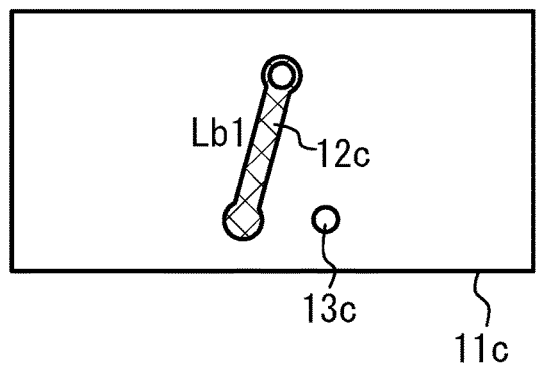
Figure 3E:
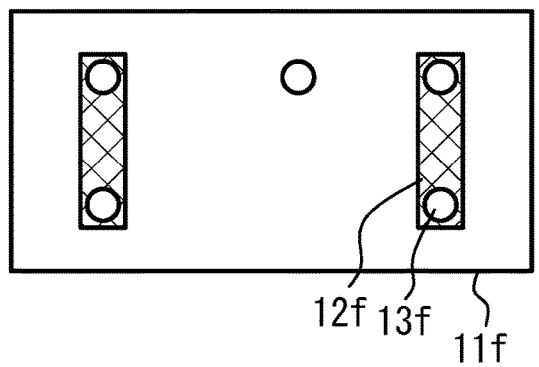
Figure 3C:
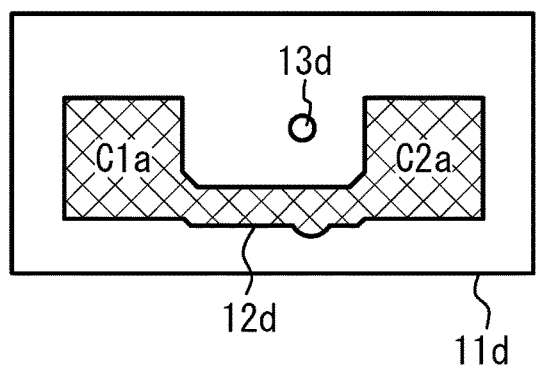
Figure 3F:
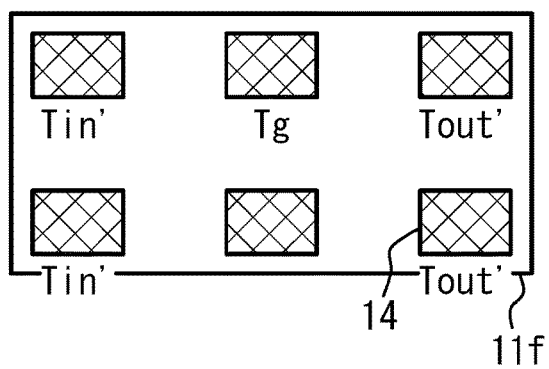

FIG. 3A to FIG. 3F are plan views of the dielectric layers in the first embodiment. FIG. 3A to FIG. 3E are plan views of the dielectric layers 11b to 11f as viewed from above, respectively. FIG. 3F is a plan view of the terminals 14 through the dielectric layer 11f. The dielectric layer 11a is not illustrated.

As illustrated in FIG. 3A to FIG. 3F, conductive patterns 12b to 12f are provided on the dielectric layers 11b to 11f, respectively, and via-wiring lines 13b to 13f penetrating through the dielectric layers 11b to 11f, respectively are provided. As illustrated in FIG. 3A, the conductive pattern 12b provided on the dielectric layer 11b forms a line L1a. As illustrated in FIG. 3B, the conductive pattern 12c provided on the dielectric layer 11c forms a line L1b. The lines L1a and L1b are electrically connected by the via-wiring line 13b to form the inductor L1.

As illustrated in FIG. 3C, the conductive pattern 12d provided on the dielectric layer 11d forms respective upper electrodes C1a and C2a of the capacitors C1 and C2. As illustrated in FIG. 3D, the conductive pattern 12e provided on the dielectric layer 11e forms respective lower electrodes C1b and C2b of the capacitors C1 and C2. The dielectric layer 11d and the electrodes C1a and C1b sandwiching the dielectric layer 11d therebetween form the capacitor C1, and the dielectric layer 11d and the electrodes C2a and C2b sandwiching the dielectric layer 11d therebetween form the capacitor C2.

As illustrated in FIG. 3E, the conductive pattern 12f provided on the dielectric layer 11f is coupled to the terminals 14 through the via-wiring line 13f. As illustrated in FIG. 3F, the terminals 14 disposed on the bottom surface of the dielectric layer 11f form an input terminal Tin', an output terminal Tout', and the ground terminals Tg. The capacitor C3 is not provided in the multilayered body 10, and the input terminal Tin' and the output terminal Tout' correspond to the nodes N2 and N3 in FIG. 1, respectively. The capacitor C3 may be mounted on, for example, the multilayered body 10. The capacitor C3 may be provided in the multilayered body 10.

The dielectric layers 11a to 11f are composed of, for example, a ceramic material, and contain an oxide containing, for example, Si, Ca, and Mg (for example, $CaMgSi_2O_6$ that is a diopside crystal) as a main component. The main components of the dielectric layers 11a to 11f may be an oxide other than an oxide containing Si, Ca, and/or Mg. Furthermore, the dielectric layers 11a to 11f may contain at least one of oxides of Ti, Zr, and Al as an insulating material. The dielectric layers 11a to 11f may be made of a resin such as a glass epoxy resin, or ceramics such as low temperature co-fired ceramics (LTCC) or high temperature co-fired ceramics (HTCC). The conductive patterns 12b to 12f, the via-wiring lines 13b to 13f, and the upper portions of the terminals 14 are formed of a non-magnetism metal layer mainly composed of, for example, Ag, Pd, Pt, Cu, Ni, Au, an Au—Pd alloy, or an Ag—Pt alloy. The upper portions of the terminals 14 may contain a non-conductive material such as, but not limited to, $TiO_2$, $ZrO_2$ or $Al_2O_3$ in addition to the above metal material. The lower portions of the terminals 14 are formed of a Ni film and a Sn film.

The transmission characteristics of the filter 100 having an attenuation pole of 3.9 GHz were simulated by circuit simulation. Table 1 presents the capacitances and the Q factors of the capacitors C1 to C3 and the inductance of the inductor L1 in the simulation.

TABLE 1

| C1 | C2 | C3 | L1 |
|---|---|---|---|
| 0.4 pF | 0.4 pF | 0.5 pF | 1.5 nH |
| Q = 50 | Q = 50 | | |

As presented in Table 1, the capacitances of the capacitors C1 to C3 were set to 0.4 pF, 0.4 pF, and 0.5 pF, respectively, and the inductance of the inductor L1 was set to 1.5 nH. The Q factors of the capacitors C1 and C2 were set to 50. The Q factor is the Q factor at the frequency of the attenuation pole.

Figure 4A:
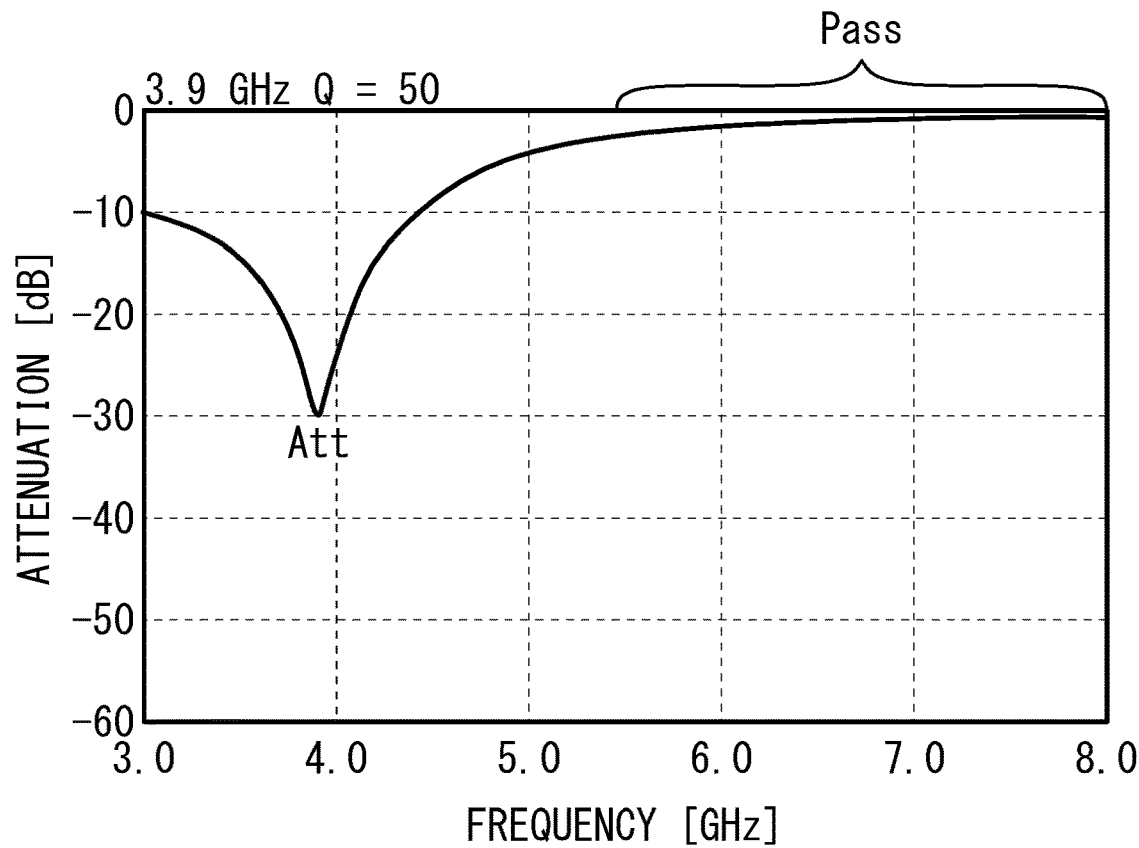
FIG. 4A and FIG. 4B illustrate the transmission characteristics of the filter in accordance with the first embodiment.
Figure 4B:
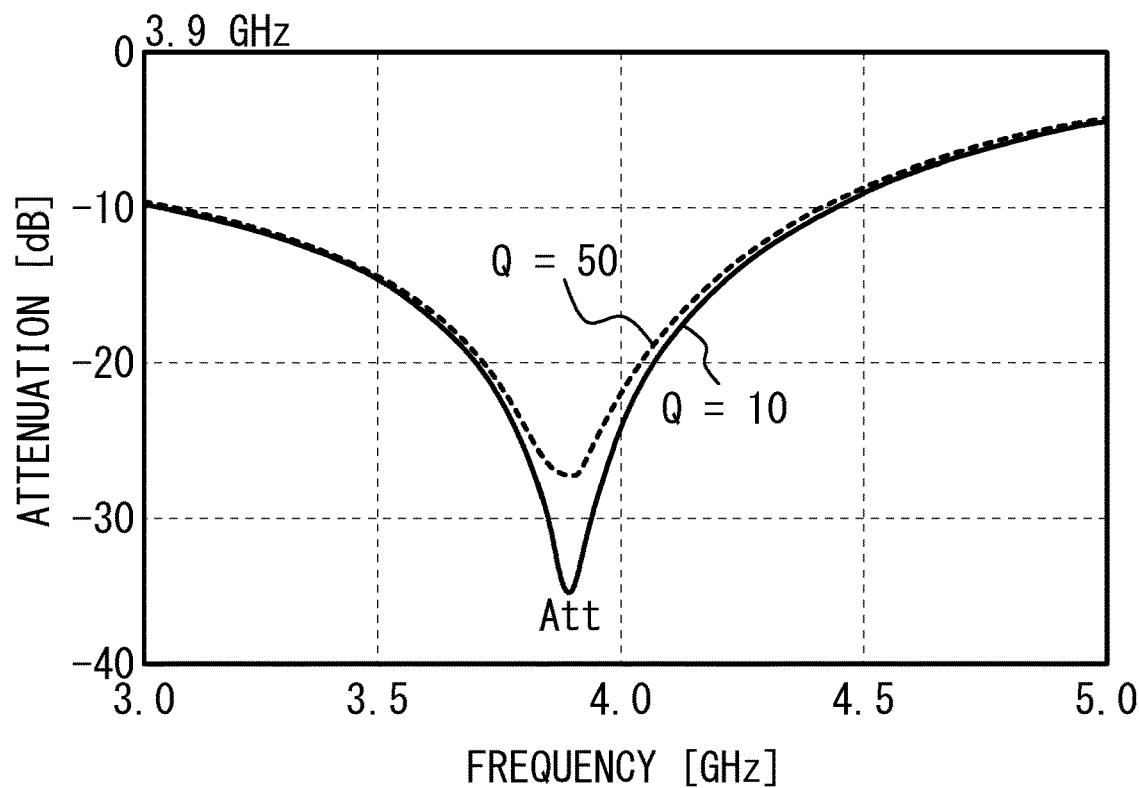

FIG. 4A and FIG. 4B illustrate the transmission characteristics of the filter in the first embodiment. FIG. 4A illustrates the transmission characteristics for the Q factor of the capacitor C3 of 50. FIG. 4B is an enlarged view of the transmission characteristics around the attenuation pole for the Q factor of the capacitor C3 of 10 and 50. As illustrated in FIG. 4A, the capacitors C1 and C2 and the inductor L1 form a T-type CLC high-pass filter, and the formed T-type CLC high-pass filter has a passband Pass of approximately 5.5 GHz or greater. By adding the capacitor C3, the attenuation pole Att having a local minimum at a frequency lower than the passband Pass is formed by the capacitors C1 to C3 and the inductor L1. The frequency of the attenuation pole Att is 3.9 GHz. When the node N1 is directly connected to the capacitor C3, the attenuation pole Att is not formed. By making the path connecting the capacitor C3 and the node N1 only two paths: the path from the capacitor C3 to the node N1 via the capacitor C1 and the path from the capacitor C3 to the node N1 via the capacitor C2, the attenuation pole Att is formed. As illustrated in FIG. 4B, the attenuation pole Att of the filter in which the Q factor of the capacitor C3 is 10 is steeper than the attenuation pole Att of the filter in which the Q factor is 50.

The transmission characteristics of the filter 100 having an attenuation pole Att of 1.8 GHz were simulated by circuit simulation. Table 2 presents the capacitances and the Q factors of the capacitors C1 to C3 and the inductance of the inductor L1 in the simulation.

TABLE 2

| C1 | C2 | C3 | L1 |
|---|---|---|---|
| 0.8 pF | 0.8 pF | 1.0 pF | 3.5 nH |
| Q = 100 | Q = 100 | | |

As presented in Table 2, the capacitances of the capacitors C1 to C3 were set to 0.8 pF, 0.8 pF, and 1.0 pF, respectively, and the inductance of the inductor L1 was set to 3.5 nH. The Q factors of the capacitors C1 and C2 were set to 100.

Figure 5A:
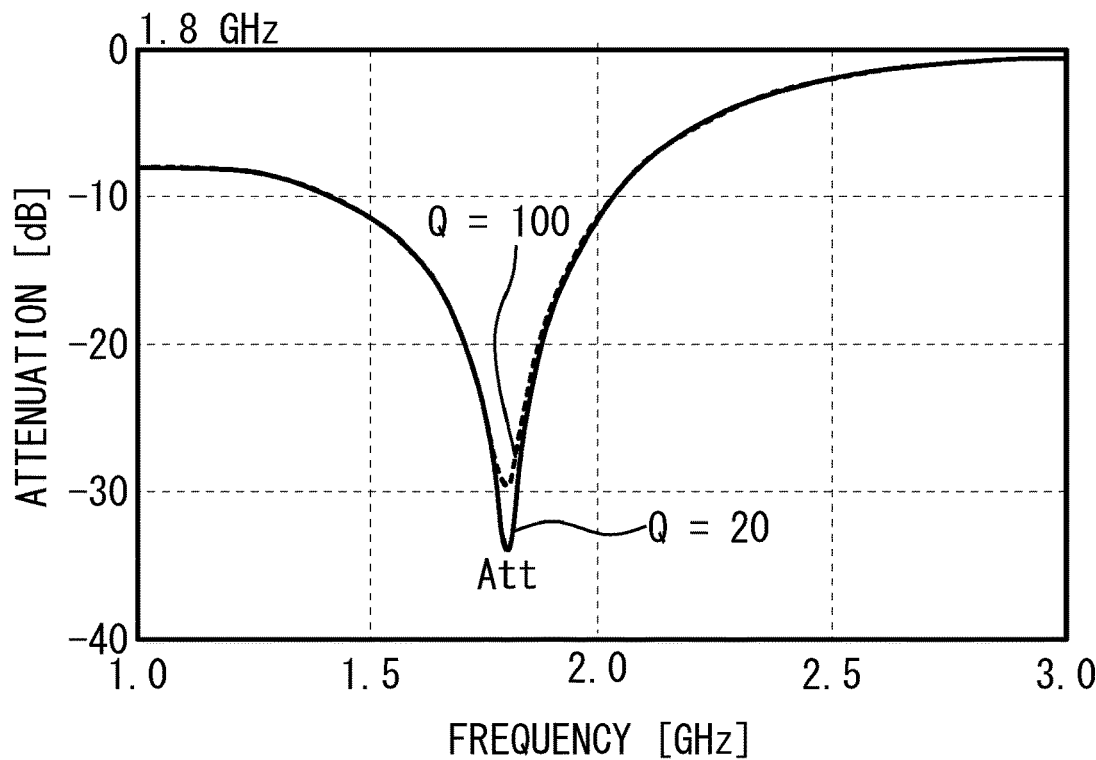
FIG. 5A illustrates the transmission characteristics of the filter in the first embodiment.
Figure 5B:
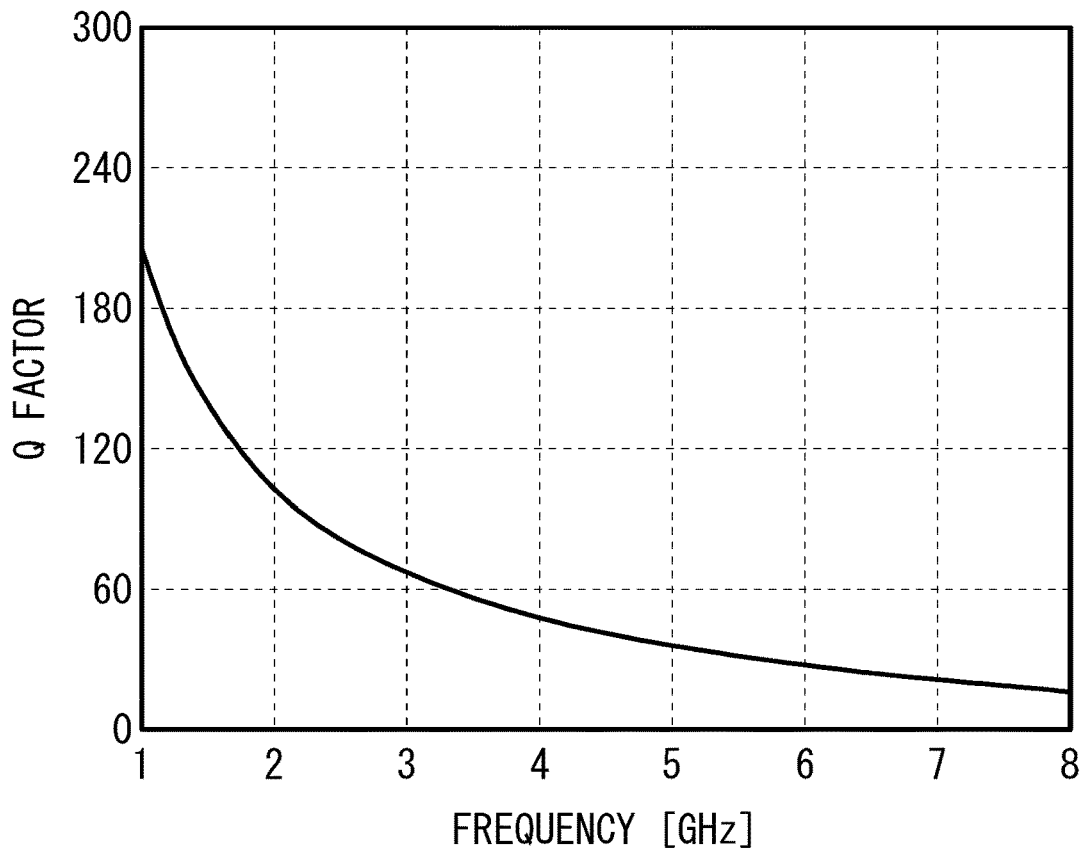
FIG. 5B is a graph of a Q factor versus frequency.

FIG. 5A illustrates the transmission characteristics of the filter in the first embodiment, and FIG. 5B is a graph of a Q factor versus frequency. As illustrated in FIG. 5B, as the frequency decreases, the Q factor increases. In the capacitor in which the Q factor at 3.9 GHz is 50, the Q factor at 1.8 GHz is 100. Thus, as presented in Table 2, the Q factors of the capacitors C1 and C2 were set to 100.

As illustrated in FIG. 5A, even when the frequency of the attenuation pole Att is adjusted to be 1.8 GHz, the attenuation pole Att of the filter in which the Q factor of the capacitor C3 is 20 is steeper than the attenuation pole Att of the filter in which the Q factor is 100.

For the filter having an attenuation pole Att of 3.9 GHz, the transmission characteristics of the filter 100 were simulated for the following Q factors Q3 of the capacitor C3: 50, 30, 20, 15, 10, 5, 4, and 3 while the Q factors Q12 of the capacitors C1 and C2 were fixed to 50. The ratio of the Q factor Q3 of the capacitor C3 to the Q factors Q12 of the capacitors C1 and C2 is represented by Q3/Q12.

Figure 6A:
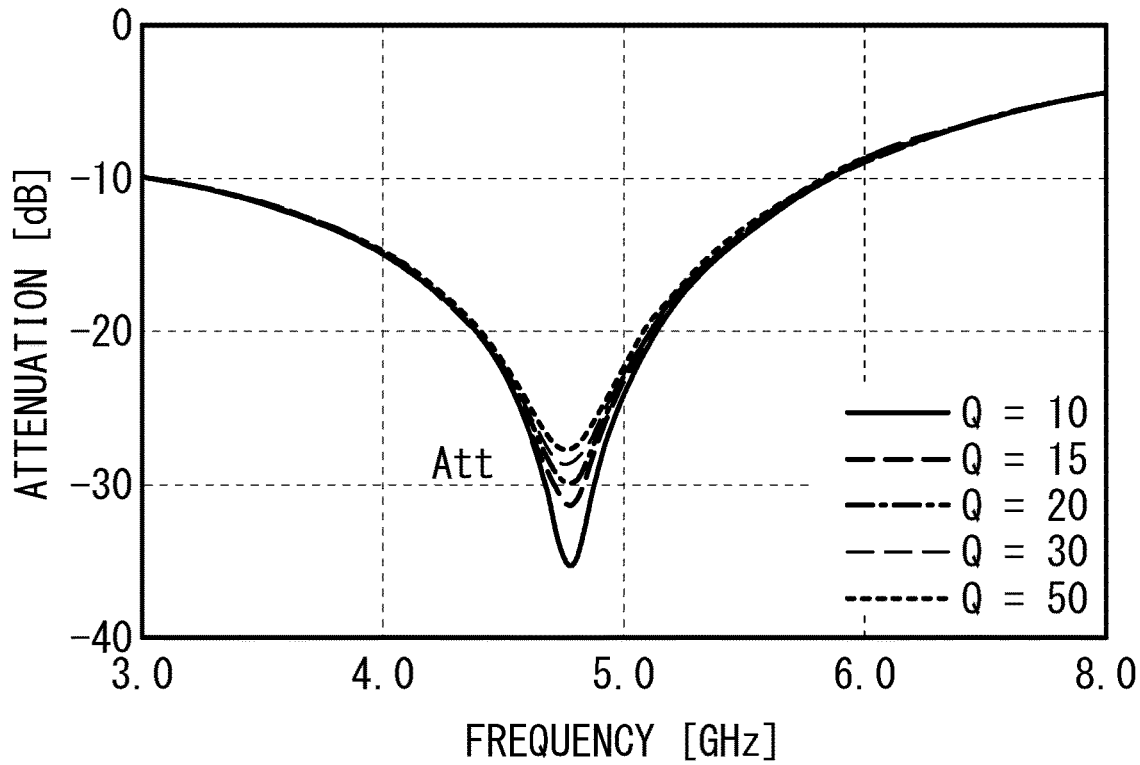
FIG. 6A and FIG. 6B illustrate the transmission characteristics of the filter in the first embodiment.
Figure 6B:
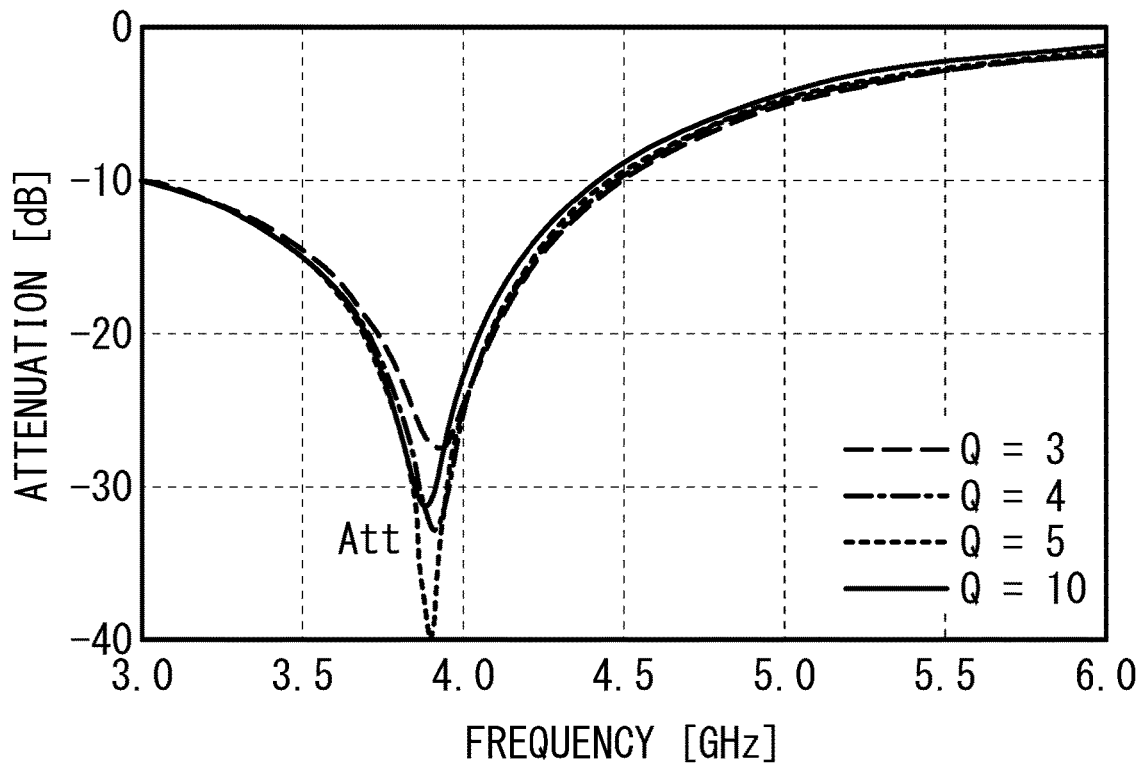

FIG. 6A and FIG. 6B illustrate the transmission characteristics of the filter in the first embodiment. As illustrated in FIG. 6A and FIG. 6B, as the Q factor Q3 of the capacitor C3 decreases, the attenuation pole Att becomes steeper. The attenuation pole Att becomes rapidly steeper for Q3 of 30 (Q3/Q12=0.6) or less, particularly for Q3 of 20 (Q3/Q12=0.4) or less, further for Q3 of 15 (Q3/Q12=0.3) or less. When Q3 is 5 (Q3/Q12=0.1), the attenuation pole Att is steepest. When Q3 is 4 (Q3/Q12=0.08), the steepness of the attenuation pole Att deteriorates, and when Q3 is 3 (Q3/Q12=0.06), the steepness of the attenuation pole Att is substantially the same as that when Q3 is 50.

First Comparative Example

Figure 7:
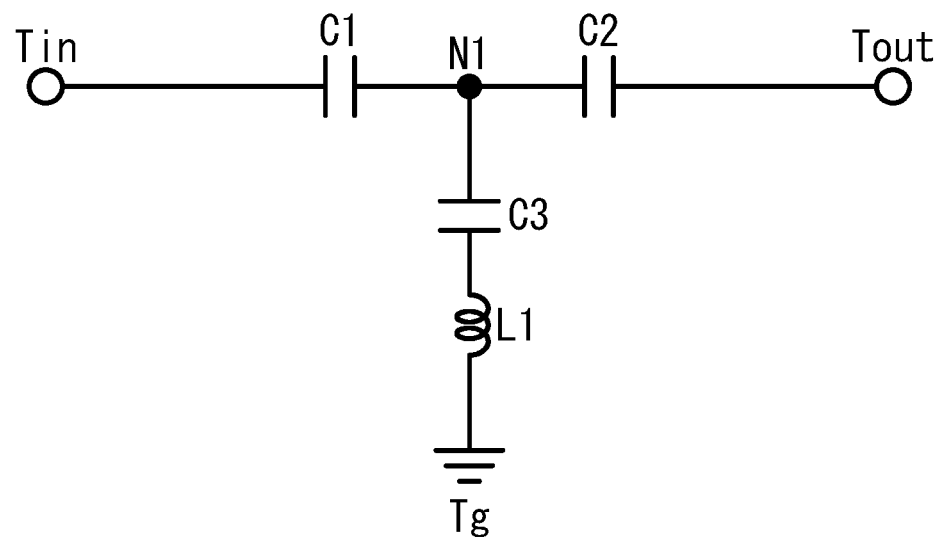
FIG. 7 is a circuit diagram of a filter in accordance with a first comparative example.

FIG. 7 is a circuit diagram of a filter in accordance with a first comparative example. As illustrated in FIG. 7, in a filter 110 of the first comparative example, the capacitor C3 is connected in series with the inductor L1 between the node N1 and the ground terminal Tg. In the first comparative example, the attenuation pole Att equivalent to that in the first embodiment can be formed by the series resonant circuit formed of the capacitor C3 and the inductor L1. Other structures are the same as those of the first embodiment, and the description thereof is thus omitted.

The transmission characteristics of the filter 110 having an attenuation pole of 3.9 GHz were simulated by circuit simulation. Table 3 presents the capacitances and the Q factors of the capacitors C1 to C3 and the inductance of the inductor L1 in the simulation.

TABLE 3

| C1 | C2 | C3 | L1 |
|---|---|---|---|
| 1.35 pF | 1.35 pF | 1.12 pF | 1.5 nH |
| Q = 50 | Q = 50 | | |

As presented in Table 3, the capacitances of the capacitors C1 to C3 were set to 1.35 pF, 1.35 pF, and 1.12 pF, respectively, and the inductance of the inductor L1 was set to 1.5 nH. The Q factors of the capacitors C1 and C2 were set to 50.

Figure 8:
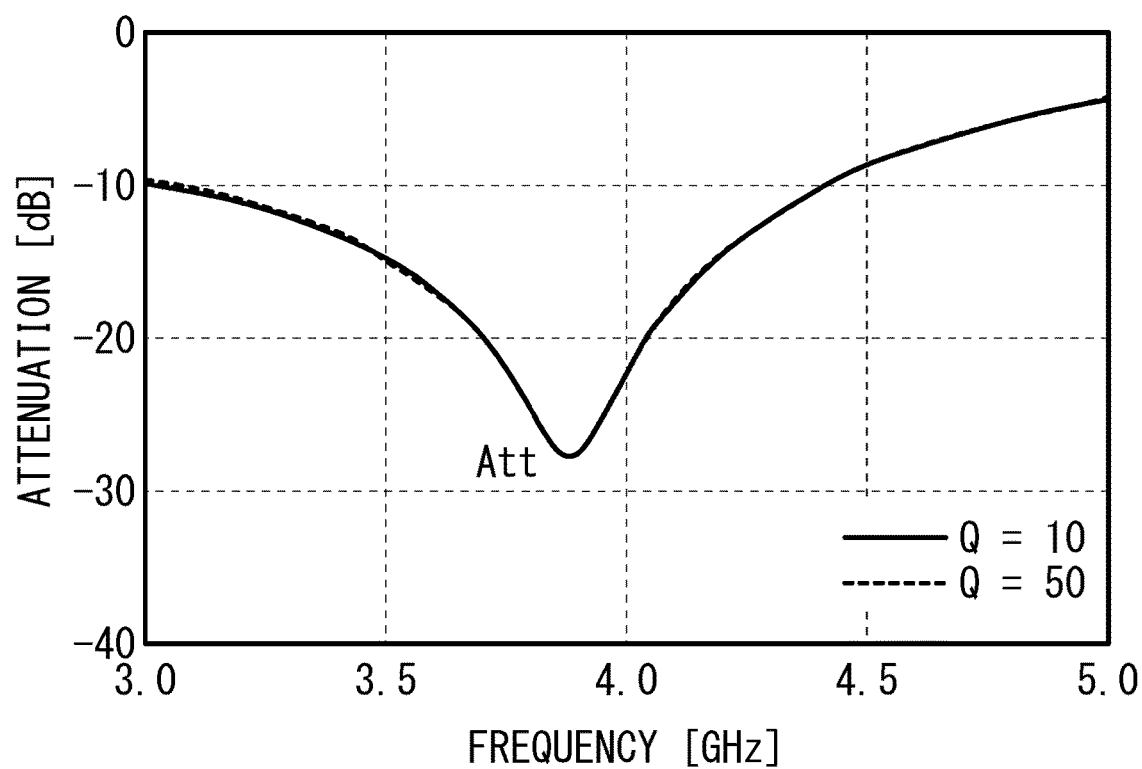
FIG. 8 illustrates the transmission characteristics of the filter in the first comparative example.

FIG. 8 illustrates the transmission characteristics of the filter in the first comparative example. As illustrated in FIG. 8, the attenuation pole Att is formed at 3.9 GHz. In the filter 110, the frequency characteristics of the attenuation pole Att are the same between the filter in which the Q factor of the capacitor C3 is 10 and the filter in which the Q factor is 50.

In the filter 110 of the first comparative example that is considered to be equivalent to the filter 100 of the first embodiment, even when the Q factor of the capacitor C3 is adjusted to be smaller than the Q factors of the capacitors C1 and C2, the attenuation pole Att does not become steeper. As seen from the above, the phenomenon that the steepness of the attenuation pole Att improves when the Q factor of the capacitor C3 is adjusted to be lower than the Q factors of the capacitors C1 and C2 is unique to the filter 100 of the first embodiment. According to the common general knowledge of persons skilled in the art, as the Q factors of the capacitor and the inductor that form the attenuation pole are increased, the attenuation pole becomes steeper. It has been revealed that the behavior of the filter 100 of the first embodiment is contrary to the common general knowledge of persons skilled in the art.

First and Second Variations of the First Embodiment

Figure 9A:
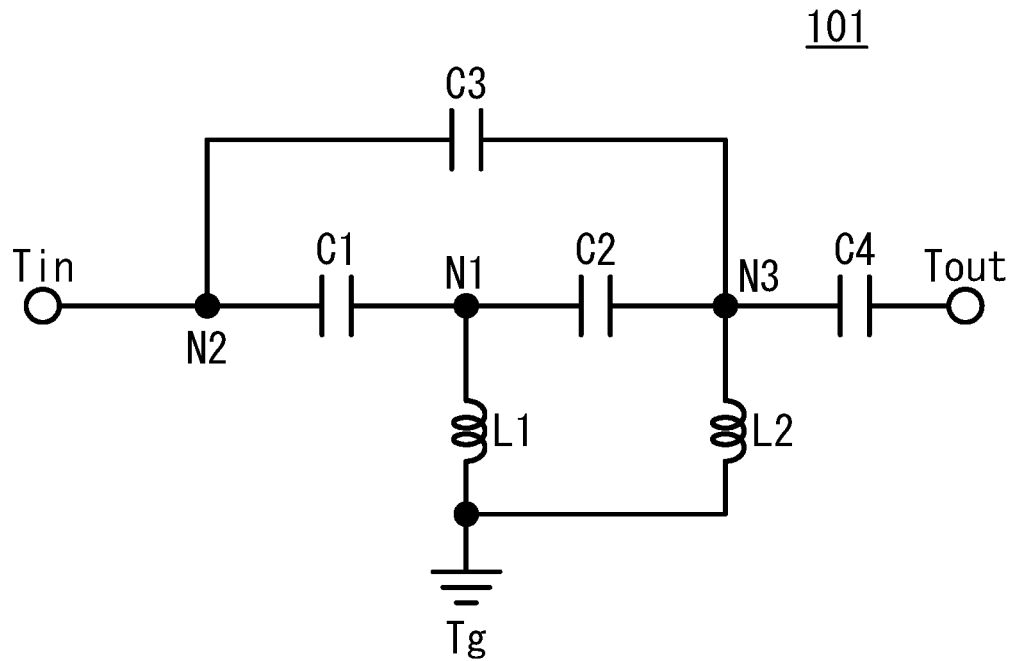
FIG. 9A and FIG. 9B are circuit diagrams of filters in accordance with first and second variations of the first embodiment, respectively.
Figure 9B:
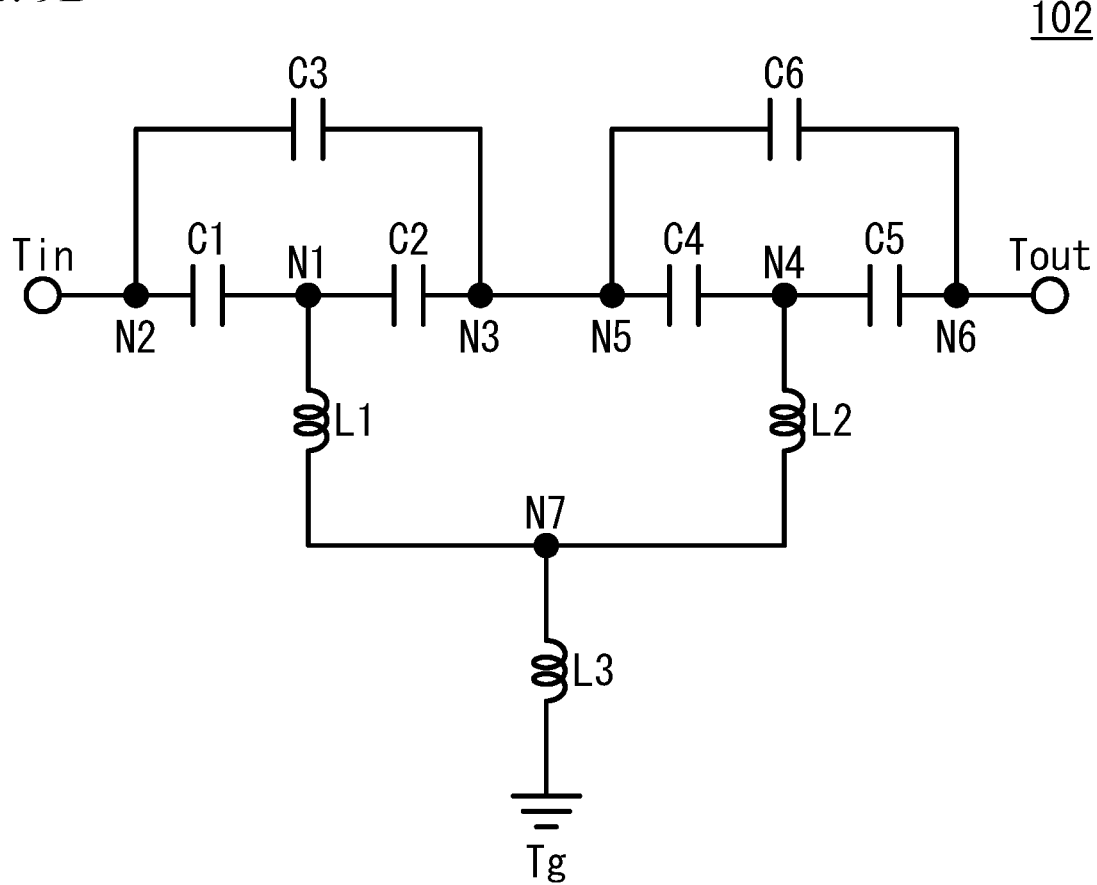

FIG. 9A and FIG. 9B are circuit diagrams of filters in accordance with first and second variations of the first embodiment, respectively. As illustrated in FIG. 9A, in a filter 101 of the first variation of the first embodiment, a capacitor C4 is connected between the node N3 and the output terminal Tout, and an inductor L2 is connected between the node N3 and the ground terminal Tg. Other structures are the same as those of the first embodiment, and the description thereof is thus omitted.

As illustrated in FIG. 9B, in a filter 102 of the second variation of the first embodiment, capacitors C4 and C5 are connected in series between the node N3 and the output terminal Tout, and a capacitor C6 is connected in parallel to the capacitors C4 and C5 between nodes N5 and N6. A first end of the inductor L2 is coupled to a node N4 between the capacitors C4 and C5. A second end of the inductor L1 and a second end of the inductor L2 are jointly coupled to a node N7. A first end of an inductor L3 is coupled to the node N7, and a second end of the inductor L3 is coupled to the ground terminal Tg. Other structures are the same as those of the first embodiment, and the description thereof is thus omitted.

The transmission characteristics of the filters 101 and 102 of the first and second variations of the first embodiment were simulated by circuit simulation. Table 4 presents the capacitances and the Q factors of the capacitors C1 to C4 and the inductances of the inductors L1 and L2 in the simulated filter 101.

TABLE 4

| C1 | C2 | C3 | C4 | L1 | L2 |
|---|---|---|---|---|---|
| 0.77 pF | 0.2354 pF | 0.25 pF | 1.241 pF | 2.055 nH | 1.29 nH |
| Q = 50 | Q = 50 | | Q = 50 | | |

As illustrated in Table 4, the capacitances of the capacitors C1 to C4 were set to 0.77 pF, 0.2354 pF, 0.25 pF, and 1.241 pF, respectively, and the inductances of the inductors L1 and L2 were set to 2.055 nH and 1.29 nH, respectively. The Q factors of the capacitors C1, C2, and C4 were set to 50. The transmission characteristics were simulated for the Q factor of the capacitor C3 of 50 and 10.

Table 5 presents the capacitances and the Q factors of the capacitors C1 to C6 and the inductances of the inductors L1 to L3 in the simulated filter 102.

TABLE 5

| C1, C5 | C2, C4 | C3, C6 | L1 | L2 | L3 |
|---|---|---|---|---|---|
| 0.22 pF | 0.25 pF | 0.4 pF | 3.0 nH | 3.0 nH | 0.005 nH |
| Q = 50 | Q = 50 | | | | |

As presented in Table 5, the capacitances of the capacitors C1 to C6 were set to 0.22 pF, 0.25 pF, 0.4 pF, 0.25 pF, 0.22 pF, and 0.4 pF, respectively, and the inductances of the inductors L1 to L3 were set to 3.0 nH, 3.0 nH, and 0.005 nH, respectively. The Q factors of the capacitors C1, C2, C4, and C5 were set to 50. The transmission characteristics were simulated for the Q factors of the capacitors C3 and C6 of 50 and 10.

Figure 10A:
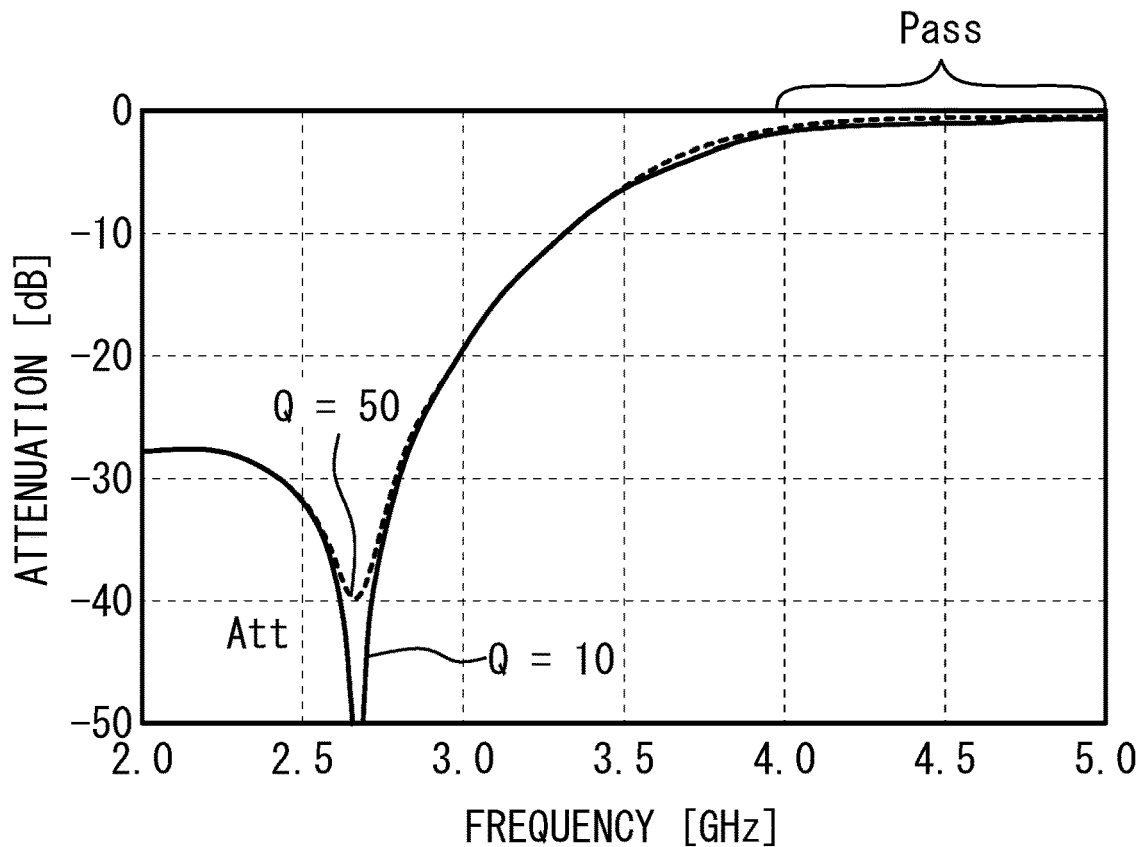
FIG. 10A and FIG. 10B illustrate the transmission characteristics of the filter in the first and second variations of the first embodiment, respectively.
Figure 10B:
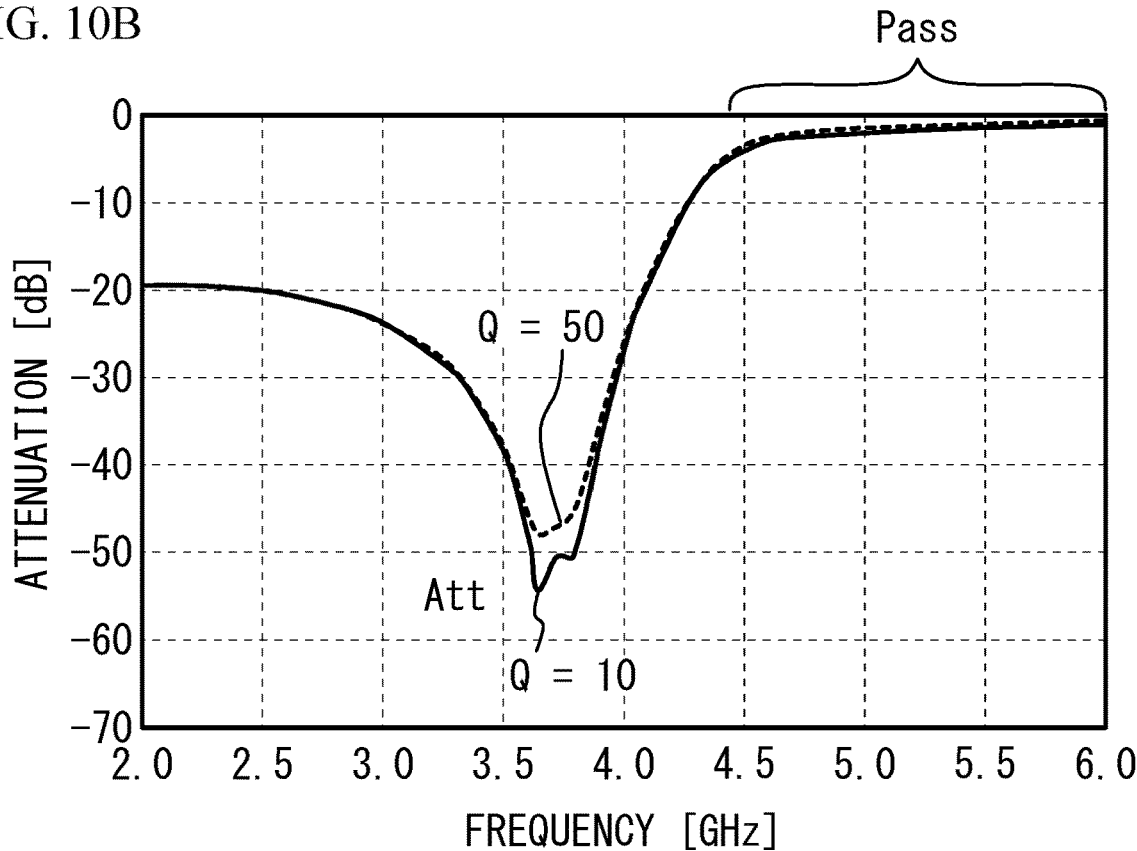

FIG. 10A and FIG. 10B illustrate the transmission characteristics of the filter in the first and second variations of the first embodiment, respectively. As illustrated in FIG. 10A, in the filter 101 of the first variation of the first embodiment, the attenuation between the passband Pass and the attenuation pole Att varies more steeply than that in the first embodiment because of the capacitor C4. When the Q factor of the capacitor C3 is set to 10, the steepness of the attenuation pole Att improves compared with that when the Q factor is 50.

As illustrated in FIG. 10B, in the filter 102 of the second variation of the first embodiment, since the filter formed of the capacitors C1 to C3 and the inductor L1 and the filter formed of the capacitors C4 to C6 and the inductor L2 are provided, the attenuation between the passband Pass and the attenuation pole Att steeply varies. Since two attenuation poles Att are formed, the width of the attenuation pole Att increases. When the Q factors of the capacitors C3 and C6 are adjusted to be 10, the steepness of the attenuation pole Att improves compared with that when the Q factors are 50.

As in the first and second variations of the first embodiment, even when other elements are provided, the steepness of the attenuation pole Att is increased by decreasing the Q factor of the capacitor C3 as long as the capacitors C1 to C3 and the inductor L1 are provided. To decrease the Q factor of the capacitor C3, it may be considered to use a material having a high tan δ for the dielectric substance of the capacitor C3 or to use a material with a high resistivity for the electrode of the capacitor C3. In these cases, it is difficult to form the capacitor C3 in the multilayered body 10, and therefore, the capacitor C3 is provided as the electronic component 26 separate from the multilayered body 10 as illustrated in FIG. 2.

In the first embodiment and the variations thereof, the capacitor C1 (a first capacitor) and the capacitor C2 (a second capacitor) are connected in series between the input terminal Tin and the output terminal Tout. The capacitor C3 is connected in parallel to the capacitors C1 and C2 between the input terminal Tin and the output terminal Tout. The node N1 is provided between the capacitors C1 and C2, and is coupled to the capacitor C3 (a capacitive element, a third capacitor) through the capacitors C1 and C2. The inductor L1 has a first end coupled to the node N1 and a second end coupled to the ground terminal Tg. In this filter, the Q factor of the capacitor C3 is adjusted to be less than the Q factor of the capacitor C1 and less than the Q factor of the capacitor C2. This allows the attenuation pole Att formed by the capacitors C1 to C3 and the inductor L1 to be steep.

The Q factor of the capacitor C3 is preferably equal to or less than 0.6 times, more preferably equal to or less than 0.4 times, further preferably equal to or less than 0.3 times the Q factor of the capacitor C1 and the Q factor of the capacitor C2. The Q factor of the capacitor C3 is preferably equal to or greater than 0.04 times, more preferably equal to or greater than 0.08 times the Q factor of the capacitor C1 and the Q factor of the capacitor C2.

As illustrated in FIG. 3A, the filter 100 is a high-pass filter having a passband Pass, and has the local minimum of the attenuation pole Att at a frequency lower than the passband Pass. By adjusting the Q factor of the capacitor C3 to be less than the Q factor of the capacitor C1 and the Q factor of the capacitor C2, the steepness of the attenuation pole Att can be improved.

Second Embodiment

In a second embodiment, even when the Q factors of the capacitors C1 to C3 are substantially equal to each other to the extent of manufacturing error, by connecting a resistive element in series with or parallel to the capacitor C3, the Q factor of the capacitor C3 can be practically reduced.

Figure 11A:
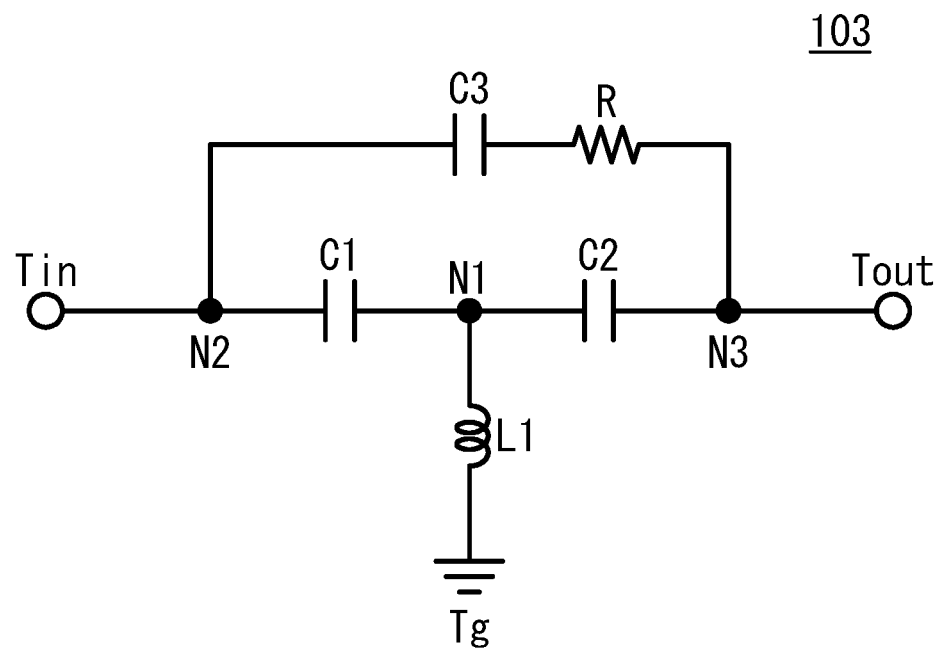
FIG. 11A and FIG. 11B are circuit diagrams of filters in accordance with a second embodiment and a first variation of the second embodiment, respectively.
Figure 11B:
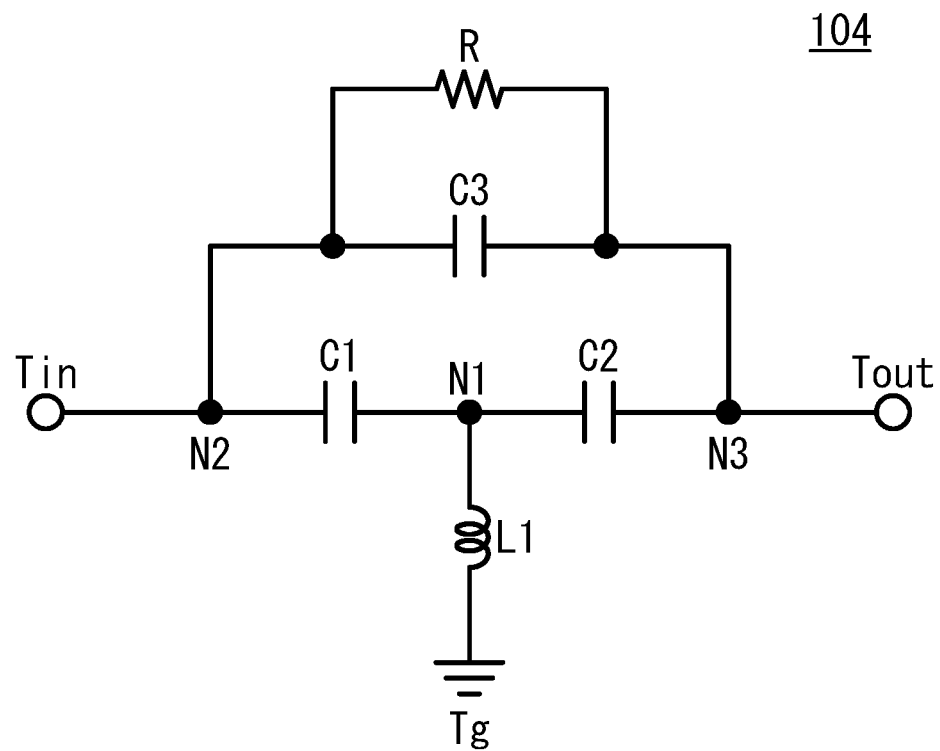

FIG. 11A and FIG. 11B are circuit diagrams of filters in accordance with the second embodiment and a first variation of the second embodiment, respectively. As illustrated in FIG. 11A, in a filter 103 of the second embodiment, a resistor R is connected in series with the capacitor C3 between the nodes N2 and N3. Other structures are the same as those of the first embodiment, and the description thereof is thus omitted.

As illustrated in FIG. 11B, in a filter 104 of the first variation of the second embodiment, the resistor R is connected in parallel to the capacitor C3 between the nodes N2 and N3. Other structures are the same as those of the first embodiment, and the description thereof is thus omitted.

In the second embodiment and the first variation of the second embodiment, the capacitors C1 to C3 and the inductor L1 may be formed in the multilayered body 10 in FIG. 2, and the electronic component 26 may be the resistor R. Alternatively, the capacitors C1 to C3, the inductor L1, and the resistor R may be formed in the multilayered body 10.

The transmission characteristics of the filters 103 and 104 of the second embodiment and the first variation of the second embodiment were simulated by circuit simulation. The capacitances and the Q factors of the capacitors C1 to C3 and the inductance of the inductor L1 are the same as listed in Table 1 of the first embodiment. The Q factor of the capacitor C3 is 50, which is the same as the Q factors of the capacitors C1 and C2.

Figure 12A:
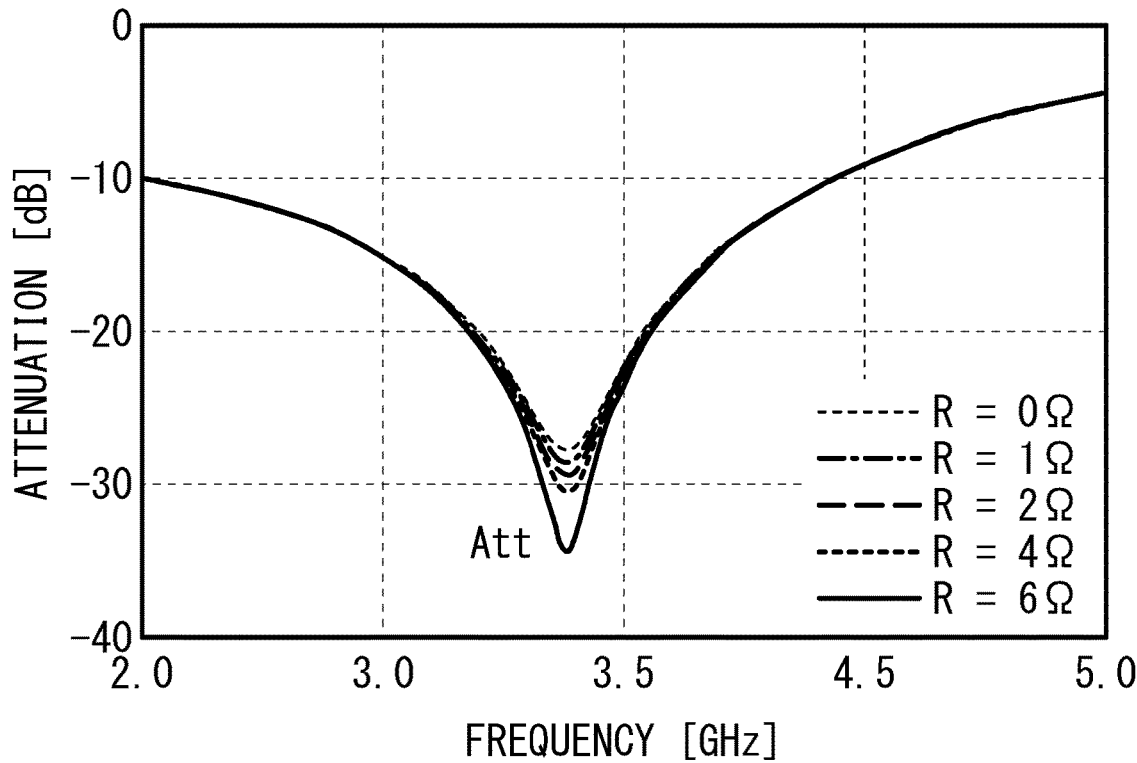
FIG. 12A and FIG. 12B illustrate the transmission characteristics of the filter in the second embodiment.
Figure 12B:
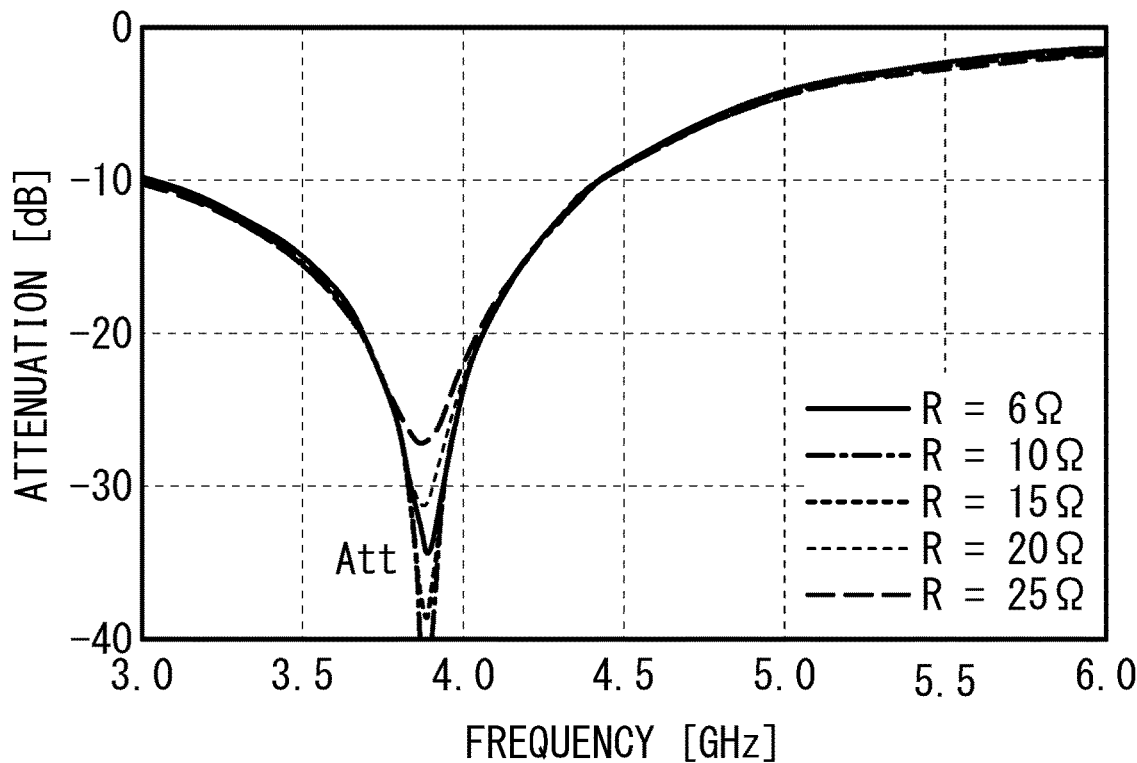

FIG. 12A and FIG. 12B illustrate the transmission characteristics of the filter 103 in the second embodiment. As illustrated in FIG. 12A and FIG. 12B, the resistance value of the resistor R was varied to be 0 Ω, 1 Ω, 2 Ω, 4 Ω, 6 Ω, 10 Ω, 15 Ω, 20Ω, and 25Ω When the resistor R is 0Ω, the transmission characteristics are the same as the transmission characteristics of the filter 100 in which the Q factor of the capacitor C3 is 50 in FIG. 4B. As the resistance value of the resistor R increases, the steepness of the attenuation pole Att increases. When R is 10Ω, the steepness of the attenuation pole Att is highest. As the resistance value of the resistor R increases higher than 10Ω, the steepness of the attenuation pole becomes lower. The steepness of the attenuation pole when R is 25Ω is substantially the same as the steepness of the attenuation pole when R is 0Ω.

Figure 13A:
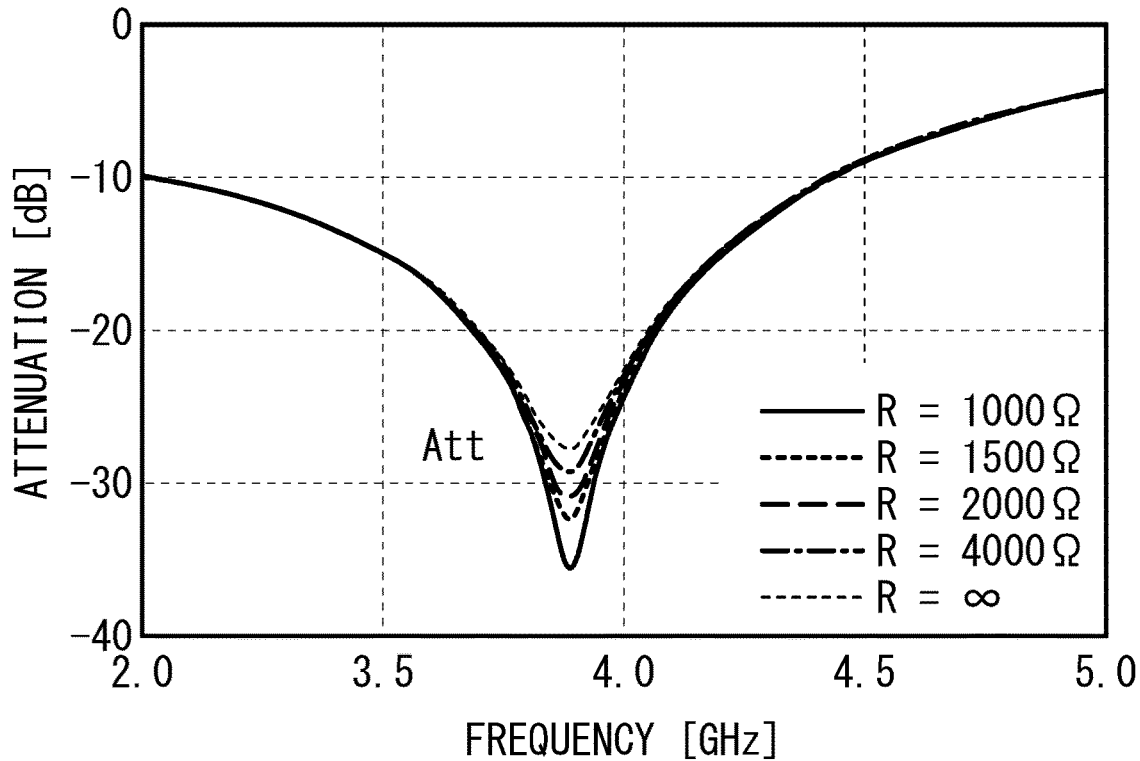
FIG. 13A and FIG. 13B illustrate the transmission characteristics of the filter in the first variation of the second embodiment.
Figure 13B:
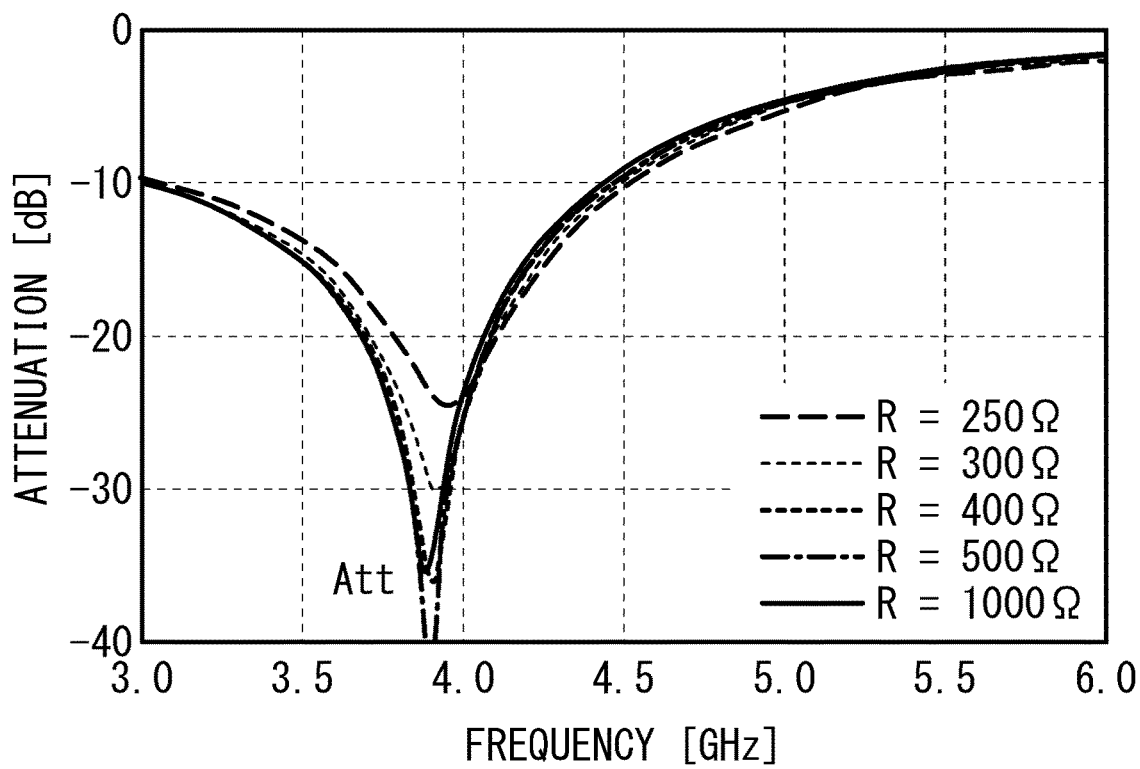

FIG. 13A and FIG. 13B illustrate the transmission characteristics of the filter 104 in the first variation of the second embodiment. As illustrated in FIG. 13A and FIG. 13B, the resistance value of the resistor R was varied to be ∞, 4000 Ω, 2000 Ω, 1500 Ω, 1000 Ω, 500 Ω, 400 Ω, 300Ω, and 250Ω. When the resistor R is 00, the transmission characteristics are the same as the transmission characteristics of the filter 100 in which the Q factor of the capacitor C3 is 50 in FIG. 4B. As the resistance value of the resistor R decreases, the steepness of the attenuation pole Att increases. When R is 500Ω, the steepness of the attenuation pole Att is highest. For the resistance value of the resistor R less than 500Ω, the steepness of the attenuation pole becomes lower. The steepness of the attenuation pole when R is 250Ω is substantially the same as the steepness of the attenuation pole when R is ∞.

In the second embodiment and the first variation of the second embodiment, the resistor R (a resistive element) is connected in parallel to the capacitors C1 and C2, and connected in series with or connected in parallel to the capacitor C3, between the input terminal Tin and the output terminal Tout. This does not intend to suggest any limitation, and they can be combined; i.e., one resistor R may be connected in series with the capacitor C3 and another resistor R may be connected in parallel to the capacitor C3. In this case, these resistors R are connected in parallel to the capacitors C1 and C2 between the input terminal Tin and the output terminal Tout. These configurations make the combined Q factor of the capacitor C3 and the resistor R between the nodes N2 and N3 lower than the Q factor of the capacitor C3 alone. Thus, even when the Q factor of the capacitor C3 is substantially equal to the Q factors of the capacitors C1 and C2 to the extent of manufacturing error, the steepness of the attenuation pole Att can be improved.

The combined Q factor of the capacitor C3 and the resistor R between the nodes N2 and N3 is preferably equal to or less than 0.6 times, more preferably equal to or less than 0.4 times, further preferably equal to or less than 0.3 times the Q factor of the capacitor C1 and the Q factor of the capacitor C2. The combined Q factor of the capacitor C3 and the resistor R is preferably equal to or greater than 0.04 times, more preferably equal to or greater than 0.08 times the Q factor of the capacitor C1 and the Q factor of the capacitor C2.

Third Embodiment

Figure 14A:
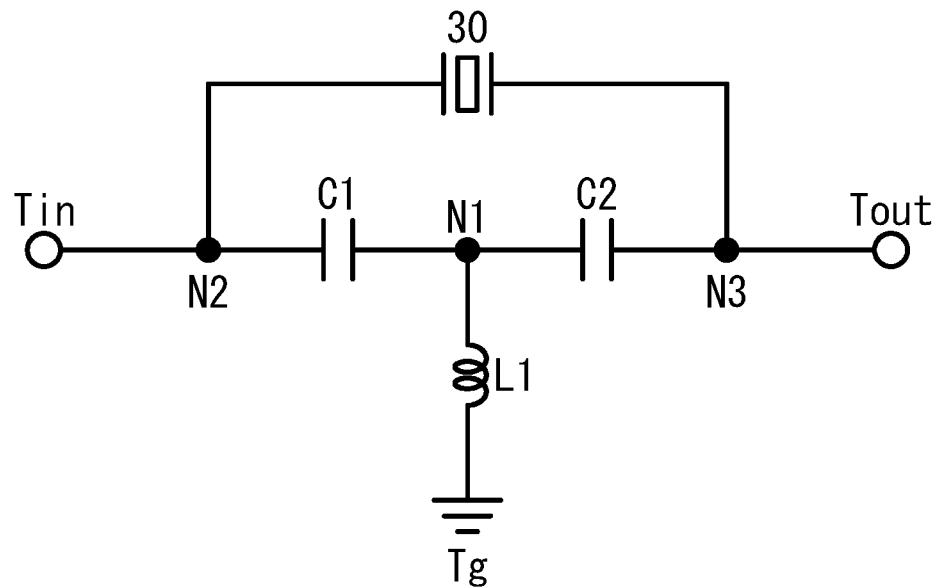
FIG. 14A and FIG. 14B are circuit diagrams of filters in accordance with a third embodiment and a first variation of the third embodiment.
Figure 14B:
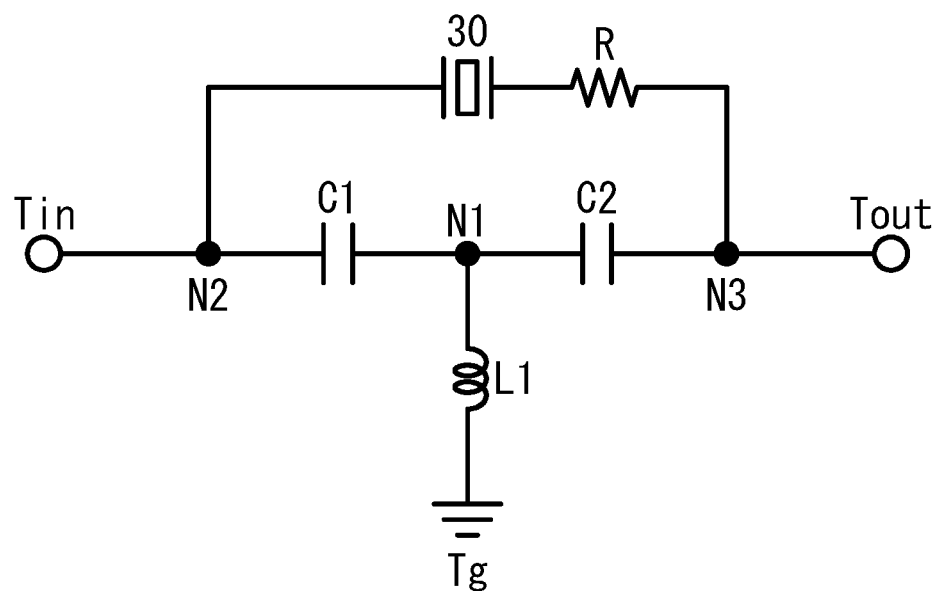

FIG. 14A and FIG. 14B are circuit diagrams of filters in accordance with a third embodiment and a first variation of the third embodiment. As illustrated in FIG. 14A, in a filter 105 of the third embodiment, instead of the capacitor C3, an acoustic wave resonator 30 is provided. Other structures are the same as those of the first embodiment, and the description thereof is thus omitted. As illustrated in FIG. 14B, in a filter 106 of the first variation of the third embodiment, the resistor R is connected in series with the acoustic wave resonator 30, between the nodes N2 and N3. Other structures are the same as those of the third embodiment, and the description thereof is thus omitted.

Figure 15A:
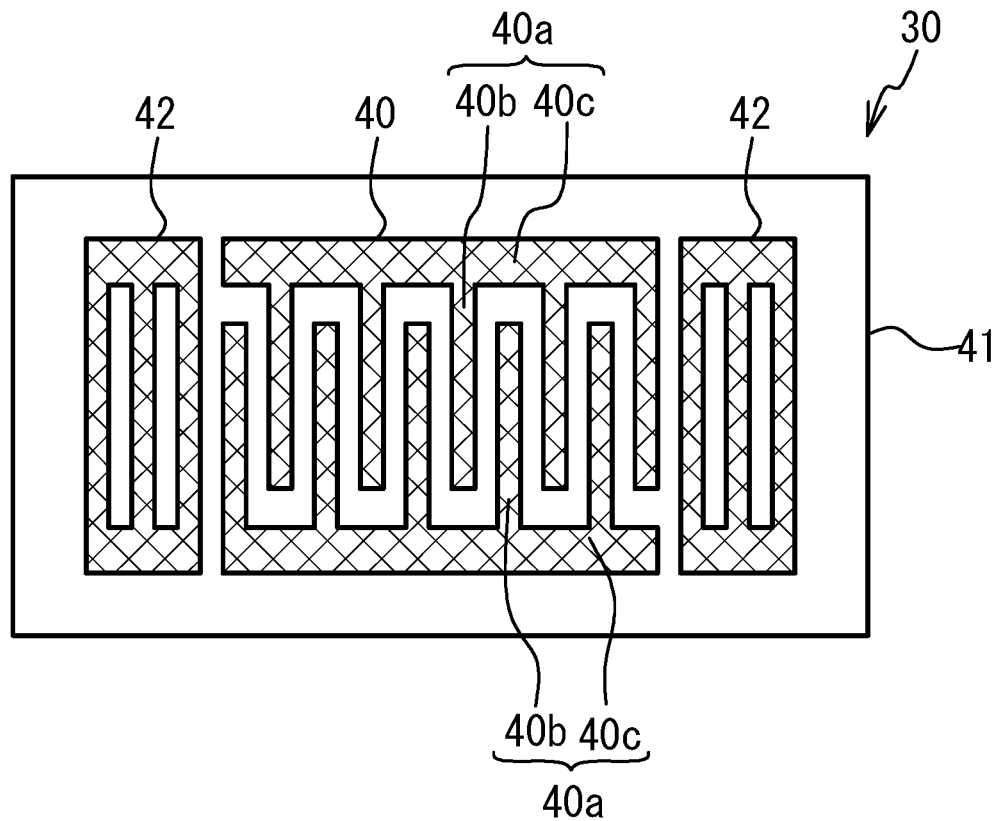
FIG. 15A is a plan view of an acoustic wave resonator in the third embodiment and the first variation of the third embodiment.
Figure 15B:
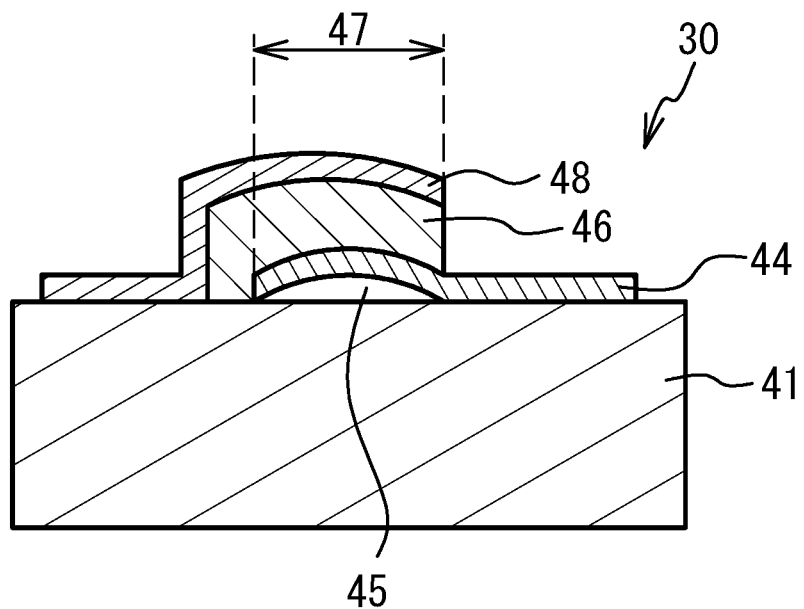
FIG. 15B is a cross-sectional view of another acoustic wave resonator in the third embodiment and the first variation of the third embodiment.

FIG. 15A is a plan view of an acoustic wave resonator in the third embodiment and the first variation of the third embodiment, and FIG. 15B is a cross-sectional view of another acoustic wave resonator in the third embodiment and the first variation of the third embodiment. In the example of FIG. 15A, the acoustic wave resonator 30 is a surface acoustic wave resonator. An interdigital transducer (IDT) 40 and reflectors 42 are disposed on the top surface of a substrate 41. The IDT 40 includes a pair of comb-shaped electrodes 40a opposite to each other. The comb-shaped electrode 40a includes electrode fingers 40b and a bus bar 40c connecting the electrode fingers 40b. The reflectors 42 are located at respective sides of the IDT 40. The IDT 40 excites the surface acoustic wave on the substrate 41. The substrate 41 is a piezoelectric substrate such as, but not limited to, a lithium tantalate substrate, a lithium niobate substrate, or a crystal substrate. The substrate 41 may be a composite substrate in which a piezoelectric substrate is bonded on a support substrate such as, but not limited to, a sapphire substrate, a spinel substrate, an alumina substrate, a crystal substrate, or a silicon substrate. The IDT 40 and the reflectors 42 are formed of, for example, an aluminum film or a copper film. A passivation film or a temperature compensation film may be provided on the substrate 41 so as to cover the IDT 40 and the reflectors 42.

In the example of FIG. 15B, the acoustic wave resonator 30 is a piezoelectric thin film resonator. A piezoelectric film 46 is provided on the substrate 41. A lower electrode 44 and an upper electrode 48 are provided so as to sandwich the piezoelectric film 46 therebetween. An air gap 45 is formed between the lower electrode 44 and the substrate 41. The region where the lower electrode 44 and the upper electrode 48 are opposite to each other across at least a part of the piezoelectric film 46 is a resonance region 47. The lower electrode 44 and the upper electrode 48 in the resonance region 47 excite the acoustic wave in the thickness extension mode or the acoustic wave in the thickness-shear mode within the piezoelectric film 46. The substrate 41 is, for example, a sapphire substrate, a spinel substrate, an alumina substrate, a glass substrate, a crystal substrate, or a silicon substrate. The lower electrode 44 and the upper electrode 48 are formed of a metal film such as, but not limited to, a ruthenium film, a monocrystalline lithium tantalate film, or a monocrystalline lithium niobate film. The piezoelectric film 46 is, for example, an aluminum nitride film. Instead of the air gap 45, the acoustic mirror may be provided.

The transmission characteristics of the filters 105 and 106 of the third embodiment and the first variation of the third embodiment were simulated by circuit simulation. The capacitances and the Q factors of the capacitors C1 and C2 and the inductance of the inductor L1 are the same as those listed in Table 1 of the first embodiment. In the filter 106 of the first variation of the third embodiment, the resistance value of the resistor R was set to 6Ω.

Figure 16:
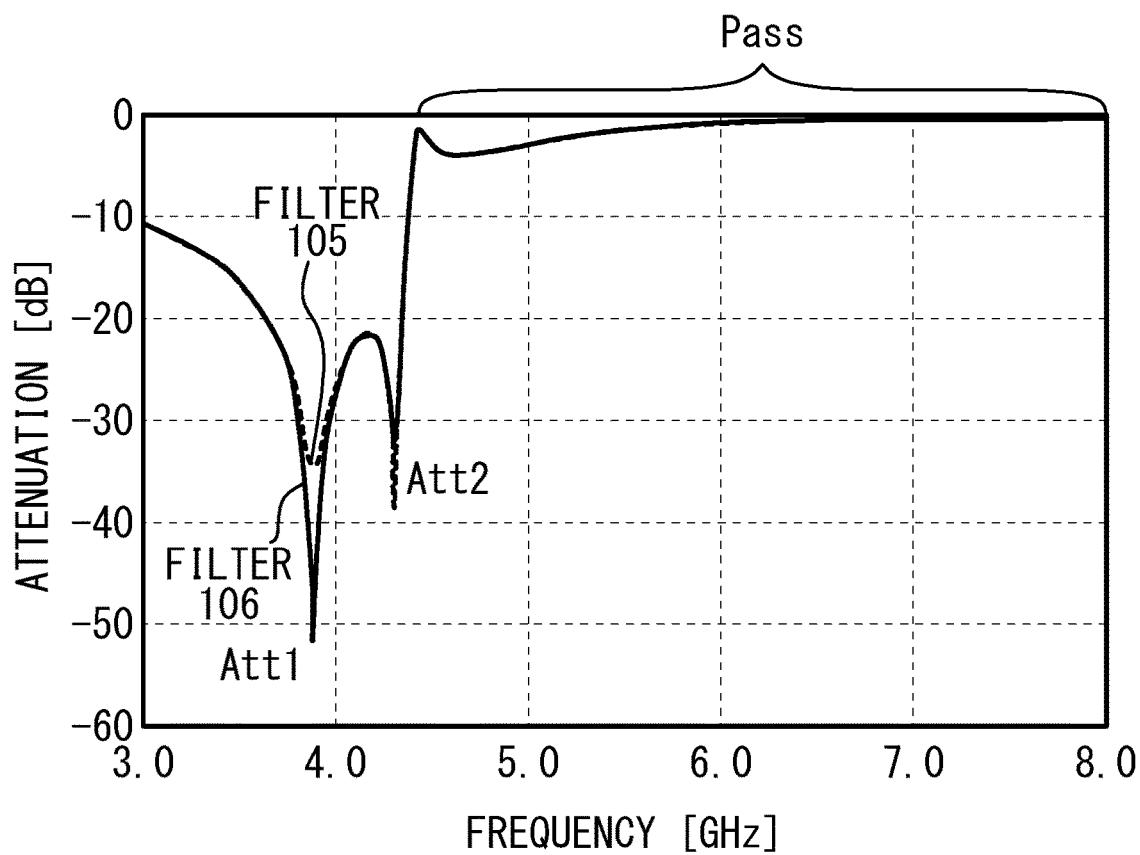
FIG. 16 illustrates the transmission characteristics of the filters in accordance with the third embodiment and the first variation of the third embodiment.

FIG. 16 illustrates the transmission characteristics of the filter in accordance with the third embodiment and the first variation of the third embodiment. The capacitances and the Q factors of the capacitors C1 and C2 and the inductance of the inductor L1 are the same as those listed in Table 1 of the first embodiment. The resonant frequency of the acoustic wave resonator 30 is 3.893 GHz, and the Q factor at the attenuation pole Att is approximately 20. As illustrated in FIG. 16, the passband Pass is approximately 4.5 GHz or greater. At the frequency of the attenuation pole Att1, the acoustic wave resonator 30 is capacitive. The capacitors C1 and C2, the inductor L1, and the capacitance of the acoustic wave resonator 30 form the attenuation pole Att1. The attenuation pole Att2 is formed between the passband Pass and the attenuation pole Att1 by the resonant frequency of the acoustic wave resonator 30. That is, the attenuation pole Att2 is formed by using the acoustic wave resonator 30 instead of the capacitor C3. As seen from FIG. 16, the attenuation pole Att2 improves the steepness of the attenuation between the passband Pass and the attenuation range. In the filter 106, by providing the resistor R, the steepness of the attenuation pole Att1 can be improved compared with that in the filter 105. In addition, in the filter 105, by adjusting the Q factor of the acoustic wave resonator 30 at the frequency of the attenuation pole Att1 to be less than the Q factors of the capacitors C1 and C2, the attenuation pole Att1 can be steepened.

Figure 17:
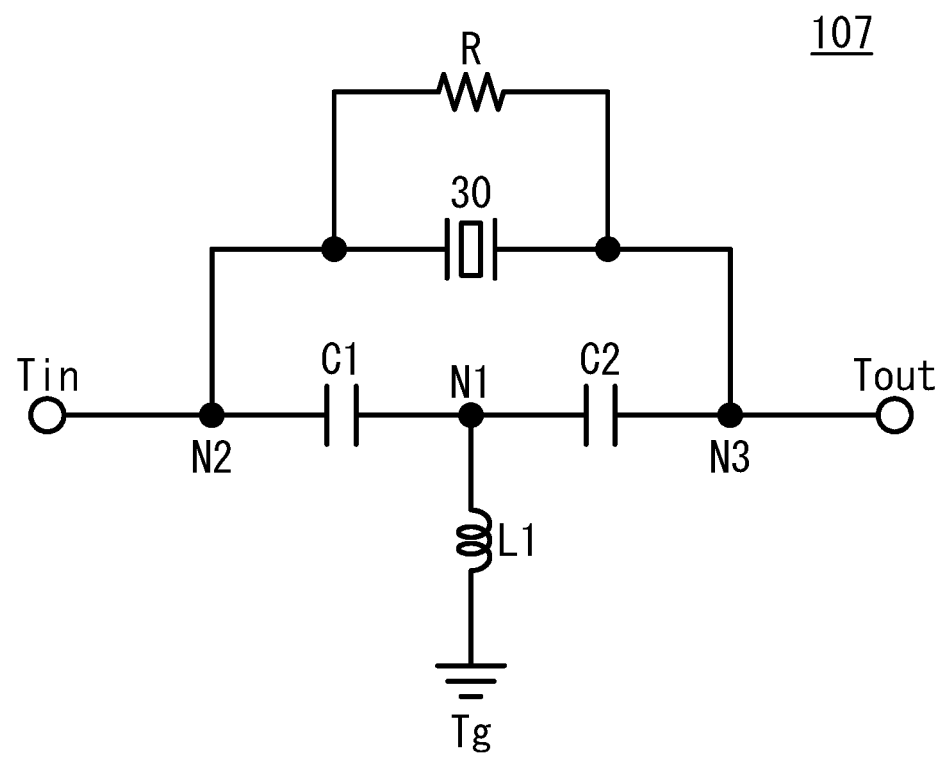
FIG. 17 is a circuit diagram of a filter in accordance with a second variation of the third embodiment.

FIG. 17 is a circuit diagram of a filter in accordance with a second variation of the third embodiment. As illustrated in FIG. 17, in a filter 107 of the second variation of the third embodiment, between the nodes N2 and N3, the resistor R is connected in parallel to the acoustic wave resonator 30. Other structures are the same as those of the third embodiment, and the description thereof is thus omitted. Also in the second variation of the third embodiment, the steepness of the attenuation pole Att1 can be improved as in the first variation of the third embodiment.

In the third embodiment and the variations of the third embodiment, the capacitive element is the acoustic wave resonator 30, and the acoustic wave resonator 30 forms a second minimum of the attenuation pole Att2 (a second attenuation pole) between the first minimum of the attenuation pole Att1 (a first attenuation pole) and the passband Pass. As seen from the above, the capacitive element may be the acoustic wave resonator 30.

Fourth Embodiment

Figure 18:
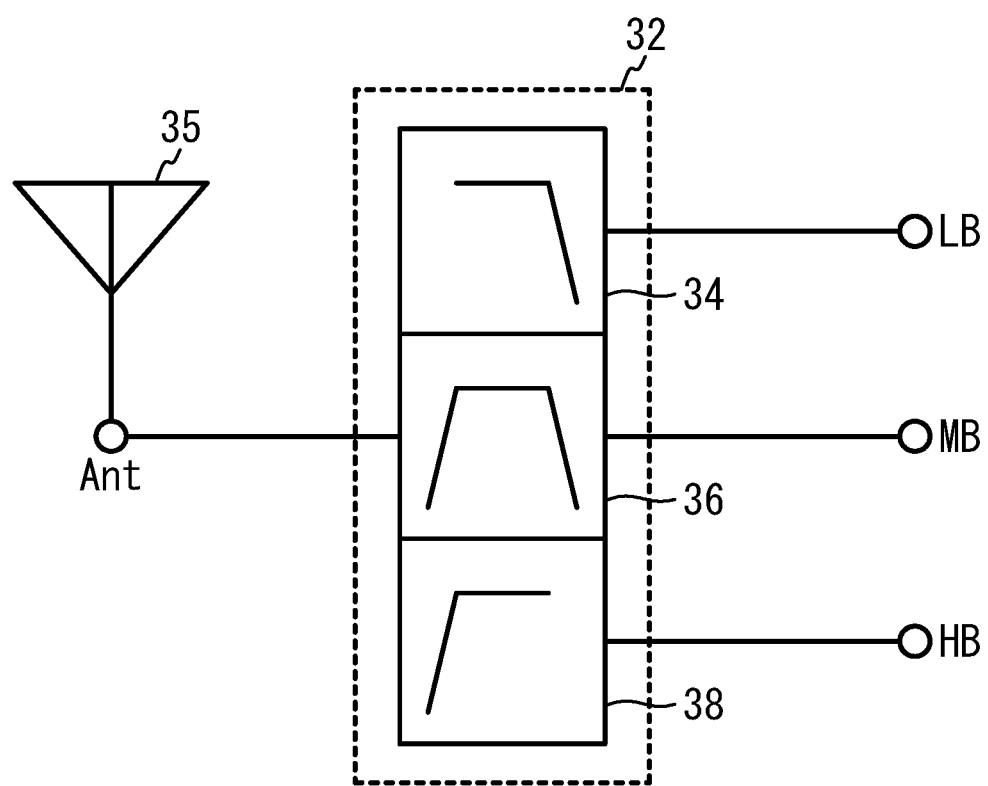
FIG. 18 is a circuit diagram of a triplexer in accordance with a fourth embodiment.

A fourth embodiment is an exemplary multiplexer in which the filter according to any one of the first to third embodiments and the variations thereof is used. FIG. 18 is a circuit diagram of a triplexer in accordance with the fourth embodiment. As illustrated in FIG. 18, a triplexer 32 includes filters 34, 36, and 38. The filter 34 is connected between a common terminal Ant and a terminal LB, the filter 36 is connected between the common terminal Ant and a terminal MB, and the filter 38 is connected between the common terminal Ant and a terminal HB. An antenna 35 is coupled to the common terminal Ant. The filter 34 is, for example, a low-pass filter, allows high-frequency signals in a low band to pass therethrough, and suppresses signals with other frequencies. The filter 36 is, for example, a bandpass filter, allows high-frequency signals in a middle band higher than the low band in frequency to pass therethrough, and suppresses signals with other frequencies. The filter 38 is, for example, a high-pass filter, allows high-frequency signals in a high band higher than the middle band in frequency, and suppresses signals with other frequencies. The filter 38 may be the filter according to any one of the first to third embodiments and the variations thereof. A triplexer has been described as an example of the multiplexer, but the multiplexer may be a diplexer, a duplexer, or a quadplexer.

Although the embodiments of the present invention have been described in detail, it is to be understood that the various change, substitutions, and alterations could be made hereto without departing from the spirit and scope of the invention.

What is claimed is:
1. A filter comprising:
an input terminal;
an output terminal;
a ground terminal;
a first capacitor and a second capacitor that are connected in series between the input terminal and the output terminal;
a capacitive element that is connected in parallel to the first capacitor and the second capacitor between the input terminal and the output terminal, and has a Q factor that is smaller than a Q factor of the first capacitor and is smaller than a Q factor of the second capacitor; and
an inductor that has a first end and a second end, the first end being coupled to a node that is provided between the first capacitor and the second capacitor and that is coupled to the capacitive element through the first capacitor and the second capacitor, the second end being coupled to the ground terminal.

2. The filter according to claim 1, wherein the Q factor of the capacitive element is equal to or less than 0.6 times the Q factor of the first capacitor and is equal to or less than 0.6 times the Q factor of the second capacitor.

3. The filter according to claim 1,
wherein the filter is a high-pass filter having a passband, and
wherein the first capacitor, the second capacitor, the capacitive element, and the inductor form a first minimum of a first attenuation pole at a frequency lower than the passband.

4. The filter according to claim 3,
wherein the capacitive element is an acoustic wave resonator, and
wherein the acoustic wave resonator forms a second minimum of a second attenuation pole between the first minimum and the passband.

5. The filter according to claim 1, wherein the capacitive element is a third capacitor.

6. A multiplexer comprising:
the filter according to claim 1.

7. A filter comprising:
an input terminal;
an output terminal;
a ground terminal;
a first capacitor and a second capacitor that are connected in series between the input terminal and the output terminal;
a capacitive element that is connected in parallel to the first capacitor and the second capacitor between the input terminal and the output terminal;
a resistive element that is connected in parallel to the first capacitor and the second capacitor and that is connected in series with, or connected in parallel with, the capacitive element, between the input terminal and the output terminal; and
an inductor that has a first end and a second end, the first end being coupled to a node that is provided between the first capacitor and the second capacitor and that is coupled to the capacitive element through the first capacitor and the second capacitor, the second end being coupled to the ground terminal,
wherein the resistive element is connected to the ground terminal only through a first path and a second path, the first path being formed by the first capacitor and the inductor and the second path being formed by the second capacitor and the inductor, so that the resistive element is not connected to the ground terminal through any path other than the first path and the second path.

8. The filter according to claim 7,
wherein the filter is a high-pass filter having a passband, and
wherein the first capacitor, the second capacitor, the capacitive element, and the inductor form a first minimum of a first attenuation pole at a frequency lower than the passband.

9. The filter according to claim 8,
wherein the capacitive element is an acoustic wave resonator, and
wherein the acoustic wave resonator forms a second minimum of a second attenuation pole between the first minimum and the passband.

10. The filter according to claim 7, wherein the capacitive element is a third capacitor.

11. The filter according to claim 10, wherein the first capacitor, the second capacitor, and the third capacitor have Q factors substantially equal to each other.

12. The filter according to claim 7, wherein said resistive element is connected in series with the capacitive element, and the filter further comprises another resistive element that is connected in parallel with the capacitive element.

13. A multiplexer comprising:
the filter according to claim 7.

14. A filter comprising:
an input terminal;
an output terminal;
a ground terminal;
a first capacitor and a second capacitor that are connected in series between the input terminal and the output terminal;
a capacitive element that is connected in parallel to the first capacitor and the second capacitor between the input terminal and the output terminal;
a resistive element that is connected in parallel to the first capacitor and the second capacitor and that is connected in series with, or connected in parallel with, the capacitive element, between the input terminal and the output terminal; and
an inductor that has a first end and a second end, the first end being coupled to a node that is provided between the first capacitor and the second capacitor and that is coupled to the capacitive element through the first capacitor and the second capacitor, the second end being coupled to the ground terminal,
wherein a combined Q factor of the capacitive element and the resistive element is equal to or less than 0.6 times a Q factor of the first capacitor and is equal to or less than 0.6 times a Q factor of the second capacitor.

15. A multiplexer comprising:
the filter according to claim 14.

* * * * *